under 35 U.S.C. 154(b) by 0 days.

(12) United States Patent
Modi et al.

(10) Patent No.: US 9,792,994 B1
(45) Date of Patent: Oct. 17, 2017

(54) BULK MODULATION SCHEME TO REDUCE I/O PIN CAPACITANCE

(71) Applicant: SanDisk Technologies LLC, Plano, TX (US)

(72) Inventors: Primit Modi, San Jose, CA (US); Venkatesh Ramachandra, San Jose, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 15/278,684

(22) Filed: Sep. 28, 2016

(51) Int. Cl.
*G11C 16/24* (2006.01)
*H01L 27/092* (2006.01)
*G11C 16/30* (2006.01)

(52) U.S. Cl.
CPC .............. *G11C 16/24* (2013.01); *G11C 16/30* (2013.01); *H01L 27/092* (2013.01)

(58) Field of Classification Search
CPC ........ G11C 16/24; G11C 16/30; H01L 27/092
USPC .......................... 365/185.18, 185.23, 185.27
See application file for complete search history.

(56) References Cited

U.S. PATENT DOCUMENTS

| 5,070,032 A | 12/1991 | Yuan et al. |
| 5,095,344 A | 3/1992 | Harari |
| 5,313,421 A | 5/1994 | Guterman et al. |
| 5,315,541 A | 5/1994 | Harari et al. |
| 5,343,063 A | 8/1994 | Yuan et al. |
| 5,513,147 A * | 4/1996 | Prickett, Jr. ............ G11C 16/12 365/185.23 |
| 5,570,315 A | 10/1996 | Tanaka et al. |
| 5,661,053 A | 8/1997 | Yuan |
| 5,768,192 A | 6/1998 | Eitan |
| 5,903,495 A | 5/1999 | Takeuchi et al. |
| 5,966,723 A | 10/1999 | James et al. |
| 6,011,725 A | 1/2000 | Eitan |
| 6,046,935 A | 4/2000 | Takeuchi et al. |
| 6,134,180 A | 10/2000 | Kim et al. |
| 6,222,762 B1 | 4/2001 | Guterman et al. |
| 7,073,010 B2 | 7/2006 | Chen et al. |
| 7,130,958 B2 | 10/2006 | Chou et al. |
| 7,151,705 B2 | 12/2006 | Polizzi et al. |
| 7,397,717 B2 | 7/2008 | Chen et al. |
| 7,558,900 B2 | 7/2009 | Jigour et al. |
| 8,102,710 B2 | 1/2012 | Pekny et al. |

(Continued)

FOREIGN PATENT DOCUMENTS

| EP | 2011122 A2 | 1/2009 |
| WO | 2009014796 A1 | 1/2009 |

OTHER PUBLICATIONS

"1-Megabit 2.7-Volt Minimum DataFlash.RTM."—AT45DB011D, Atmel, Apr. 2009, 52 pages.

(Continued)

*Primary Examiner* — Ly D Pham
(74) *Attorney, Agent, or Firm* — Foley & Lardner LLP

(57) ABSTRACT

A driver circuit, such as could be used as an off-chip driver for an I/O pin on a memory circuit, is presented. The driver has a PMOS connected between a supply level and the driver's output node. In an active mode, the bulk terminal of the PMOS is connected to the supply level; and in a standby mode, the PMOS's bulk terminal is set to a higher level. This reduces the leakage current through the PMOS in the standby mode, allowing for smaller device with a lower capacitance to be used.

18 Claims, 27 Drawing Sheets

(56) References Cited

U.S. PATENT DOCUMENTS

| | | | |
|---|---|---|---|
| 8,103,936 B2 | 1/2012 | Pekny et al. | |
| 8,933,516 B1 | 1/2015 | Wu et al. | |
| 9,385,721 B1 | 7/2016 | Rajendra et al. | |
| 2004/0189345 A1* | 9/2004 | Ker | H03K 19/00361 326/83 |
| 2006/0023519 A1* | 2/2006 | Choi | G11C 7/06 365/189.09 |
| 2006/0092715 A1 | 5/2006 | Braun et al. | |
| 2006/0119380 A1 | 6/2006 | Gonzalez | |
| 2006/0268642 A1 | 11/2006 | Chen et al. | |
| 2007/0081389 A1* | 4/2007 | Tran | G11C 7/02 365/185.21 |
| 2007/0285121 A1 | 12/2007 | Park et al. | |
| 2008/0052448 A1 | 2/2008 | Minz et al. | |
| 2008/0162778 A1 | 7/2008 | Choi et al. | |
| 2008/0174359 A1* | 7/2008 | Osada | H03K 19/0008 327/534 |
| 2009/0276561 A1 | 11/2009 | Pekny et al. | |
| 2010/0049948 A1 | 2/2010 | Jigour et al. | |
| 2010/0202227 A1 | 8/2010 | Nguyen et al. | |
| 2010/0321102 A1* | 12/2010 | Kong | H03K 19/0016 327/544 |
| 2011/0264851 A1 | 10/2011 | Jeon et al. | |
| 2012/0113732 A1 | 5/2012 | Sohn et al. | |
| 2016/0204783 A1 | 7/2016 | Rajendra et al. | |
| 2016/0216319 A1* | 7/2016 | Na | G01R 31/31716 |

OTHER PUBLICATIONS

"Microns.RTM. Serial NAND Flash Memory," Micron Technology Inc., Jul. 28, 2009, 2 pages.

"Open NAND Flash Interface Specification," ONFI Work Group, Revision 2.0, Mar. 9, 2011, pp. 1-282.

Eitan et al., "NROM: A Novel Localized Trapping, 2-Bit Nonvolatile Memory Cell," IEEE Electron Device Letters, vol. 21(11):543-545, Nov. 2000.

Wu et al., "High capacity select switches for three-dimensional structures," U.S. Appl. No. 13/925,662, filed Jun. 24, 2013.

\* cited by examiner

Programming into four states represented by a 2-bit code

FIG. 4.17

BULK MODULATION SCHEME TO REDUCE I/O PIN CAPACITANCE

BACKGROUND

This application relates to driver circuits for transmitting signals from integrated circuits.

Integrated circuit need to accurately and rapidly transmit data and command signal between elements. To take an example, solid-state non-volatile memory circuits receive data and instructions received from a controller at an input receiver, after which the signals are transmitted by various transmitters, repeater circuits, and receivers as these signals are passed to various registers and other elements on the circuit. Memory circuits also need to transmit signals back off of the circuit. Given the large number of such signals, reducing the amount of power consumer and increasing speed is of particular importance, a situation becoming more acute as signal rates increase.

SUMMARY

A driver circuit includes a PMOS transistor connected between a supply voltage and an intermediate node and having a control gate connected to receive an input signal and an NMOS transistor connected between the intermediate node and ground and having a control gate connected to receive the input signal, wherein an output of the driver is provided from the intermediate node. A bulk biasing circuit is connected to a body terminal of the PMOS transistor and connected to receive a mode enable signal. When the mode enable signal is asserted the bulk biasing circuit biases the body terminal to the supply voltage and when the mode enable signal is de-asserted the bulk biasing circuit biases the body terminal to a voltage greater than the supply voltage.

A non-volatile memory circuit includes a chip enable pin connectable to receive a chip enable signal, an input-output pin connectable to provide an output signal, and a driver circuit connected to receive the chip enable signal and receive a on-chip signal. The driver circuit includes a PMOS transistor, an NMOS transistor, and a bulk biasing circuit. The PMOS transistor is connected between an on-chip supply voltage and an intermediate node and has a control gate connected to receive the on-chip signal, the intermediate node being connected to the input-output pin. The NMOS transistor is connected between the intermediate node and ground and has a control gate connected to receive the on-chip signal. The bulk biasing circuit is connected to a body terminal of the PMOS transistor and is connected to receive the chip enable signal. When the chip enable signal is asserted the bulk biasing circuit biases the body terminal to the supply voltage and when the chip enable signal is de-asserted the bulk biasing circuit biases the body terminal to a voltage greater than the supply voltage.

A method includes supplying a driver circuit with a first supply voltage. The driver circuit includes: a first PMOS transistor connected between the first supply voltage and an intermediate node and having a control gate connected to receive an input signal; and a first NMOS transistor connected between the intermediate node and ground and having a control gate connected to receive an input signal, wherein an output of the driver is provided from the intermediate node. The method also includes, in response to an enable signal, operating the driver circuit in either an active mode, in which a body terminal of the first PMOS is biased to the first supply voltage, or a standby mode, in which the body terminal of the first PMOS is biased to a voltage greater than the first supply voltage.

Various aspects, advantages, features and embodiments are included in the following description of exemplary examples thereof, which description should be taken in conjunction with the accompanying drawings. All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

DETAILED DESCRIPTION

Memory System

Figure 1:
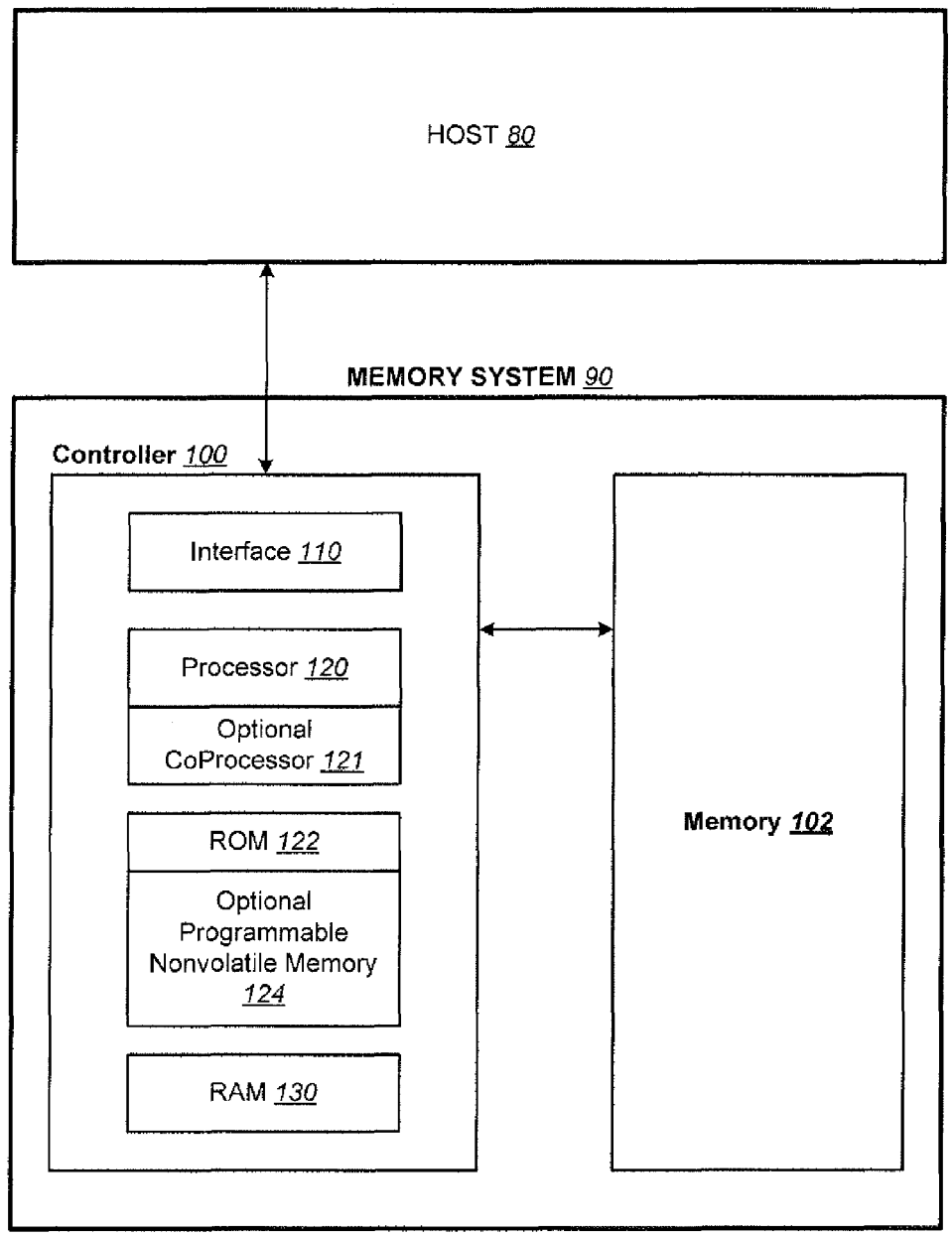
FIG. 1 illustrates schematically the main hardware components of a memory system suitable for implementing various aspects described in the following.

FIG. 1 illustrates schematically the main hardware components of a memory system suitable for implementing the following. The memory system 90 typically operates with a host 80 through a host interface. The memory system may be in the form of a removable memory such as a memory card, or may be in the form of an embedded memory system. The memory system 90 includes a memory 102 whose operations are controlled by a controller 100. The memory 102 comprises one or more array of non-volatile memory cells distributed over one or more integrated circuit chip. The controller 100 may include interface circuits 110, a processor 120, ROM (read-only-memory) 122, RAM (random access memory) 130, programmable nonvolatile memory 124, and additional components. The controller is typically formed as an ASIC (application specific integrated circuit) and the components included in such an ASIC generally depend on the particular application.

With respect to the memory section 102, semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

Figure 2:
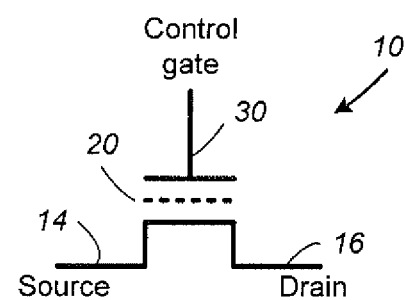
FIG. 2 illustrates schematically a non-volatile memory cell.

It will be recognized that the following is not limited to the two dimensional and three dimensional exemplary structures described but cover all relevant memory structures within the spirit and scope as described herein Physical Memory Structure FIG. 2 illustrates schematically a non-volatile memory cell. The memory cell 10 can be implemented by a field-effect transistor having a charge storage unit 20, such as a floating gate or a charge trapping (dielectric) layer. The memory cell 10 also includes a source 14, a drain 16, and a control gate 30.

There are many commercially successful non-volatile solid-state memory devices being used today. These memory devices may employ different types of memory cells, each type having one or more charge storage element.

Typical non-volatile memory cells include EEPROM and flash EEPROM. Also, examples of memory devices utilizing dielectric storage elements.

In practice, the memory state of a cell is usually read by sensing the conduction current across the source and drain electrodes of the cell when a reference voltage is applied to the control gate. Thus, for each given charge on the floating gate of a cell, a corresponding conduction current with respect to a fixed reference control gate voltage may be detected. Similarly, the range of charge programmable onto the floating gate defines a corresponding threshold voltage window or a corresponding conduction current window.

Alternatively, instead of detecting the conduction current among a partitioned current window, it is possible to set the threshold voltage for a given memory state under test at the control gate and detect if the conduction current is lower or higher than a threshold current (cell-read reference current). In one implementation the detection of the conduction current relative to a threshold current is accomplished by examining the rate the conduction current is discharging through the capacitance of the bit line.

Figure 3:
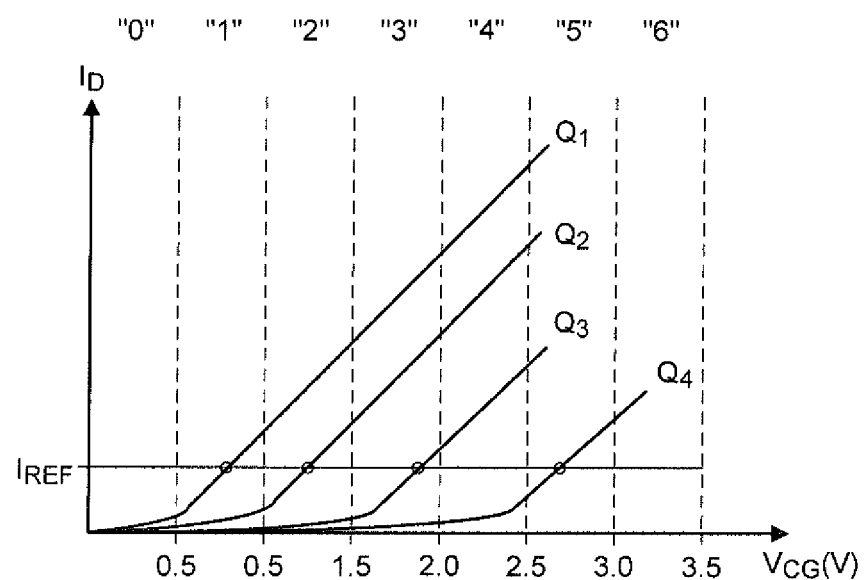
FIG. 3 illustrates the relation between the source-drain current $I_D$ and the control gate voltage $V_{CG}$ for four different charges Q1-Q4 that the floating gate may be selectively storing at any one time at fixed drain voltage.

FIG. 3 illustrates the relation between the source-drain current $I_D$ and the control gate voltage $V_{CG}$ for four different charges Q1-Q4 that the floating gate may be selectively storing at any one time. With fixed drain voltage bias, the four solid $I_D$ versus $V_{CG}$ curves represent four of seven possible charge levels that can be programmed on a floating gate of a memory cell, respectively corresponding to four possible memory states. As an example, the threshold voltage window of a population of cells may range from 0.5V to 3.5V. Seven possible programmed memory states "0", "1", "2", "3", "4", "5", "6", and an erased state (not shown) may be demarcated by partitioning the threshold window into regions in intervals of 0.5V each. For example, if a reference current, IREF of 2 µA is used as shown, then the cell programmed with Q1 may be considered to be in a memory state "1" since its curve intersects with $I_{REF}$ in the region of the threshold window demarcated by VCG=0.5V and 1.0V. Similarly, Q4 is in a memory state "5".

As can be seen from the description above, the more states a memory cell is made to store, the more finely divided is its threshold window. For example, a memory device may have memory cells having a threshold window that ranges from −1.5V to 5V. This provides a maximum width of 6.5V. If the memory cell is to store 16 states, each state may occupy from 200 mV to 300 mV in the threshold window. This will require higher precision in programming and reading operations in order to be able to achieve the required resolution.

NAND Structure

Figure 4:
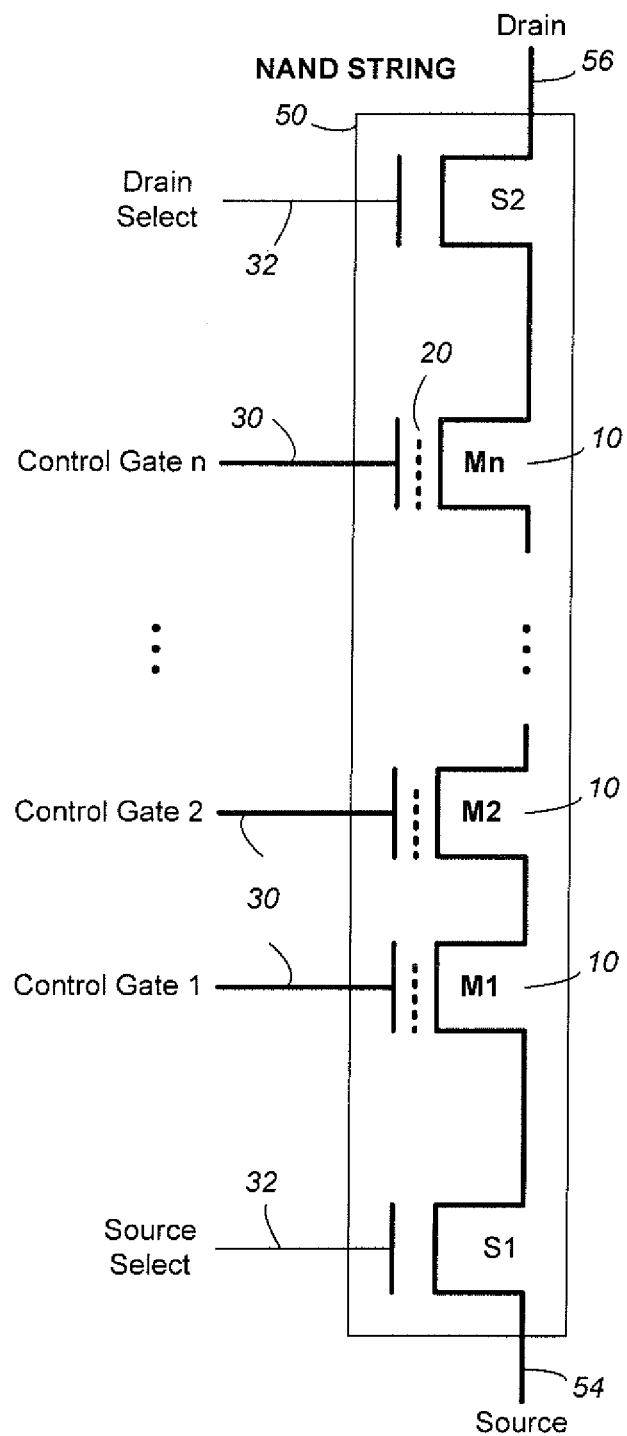
FIG. 4 illustrates schematically a string of memory cells organized into a NAND string.

FIG. 4 illustrates schematically a string of memory cells organized into a NAND string. A NAND string 50 comprises a series of memory transistors M1, M2, Mn (e.g., n=4, 8, 16 or higher) daisy-chained by their sources and drains. A pair of select transistors S1, S2 controls the memory transistor chain's connection to the external world via the NAND string's source terminal 54 and drain terminal 56 respectively. In a memory array, when the source select transistor S1 is turned on, the source terminal is coupled to a source line (see FIG. 5). Similarly, when the drain select transistor S2 is turned on, the drain terminal of the NAND string is coupled to a bit line of the memory array. Each memory transistor 10 in the chain acts as a memory cell. It has a charge storage element 20 to store a given amount of charge so as to represent an intended memory state. A control gate 30 of each memory transistor allows control over read and write operations. As will be seen in FIG. 5, the control gates 30 of corresponding memory transistors of a row of NAND string are all connected to the same word line. Similarly, a control gate 32 of each of the select transistors S1, S2 provides control access to the NAND string via its source terminal 54 and drain terminal 56 respectively. Likewise, the control gates 32 of corresponding select transistors of a row of NAND string are all connected to the same select line.

When an addressed memory transistor 10 within a NAND string is read or is verified during programming, its control gate 30 is supplied with an appropriate voltage. At the same time, the rest of the non-addressed memory transistors in the NAND string 50 are fully turned on by application of sufficient voltage on their control gates. In this way, a conductive path is effectively created from the source of the individual memory transistor to the source terminal 54 of the NAND string and likewise for the drain of the individual memory transistor to the drain terminal 56 of the cell.

FIG. 4B illustrates an example of a NAND array 210 of memory cells, constituted from NAND strings 50 such as that shown in FIG. 4. Along each column of NAND strings, a bit line such as bit line 36 is coupled to the drain terminal 56 of each NAND string. Along each bank of NAND strings, a source line such as source line 34 is coupled to the source terminals 54 of each NAND string. Also the control gates along a row of memory cells in a bank of NAND strings are connected to a word line such as word line 42. The control gates along a row of select transistors in a bank of NAND strings are connected to a select line such as select line 44. An entire row of memory cells in a bank of NAND strings can be addressed by appropriate voltages on the word lines and select lines of the bank of NAND strings.

Figure 5:
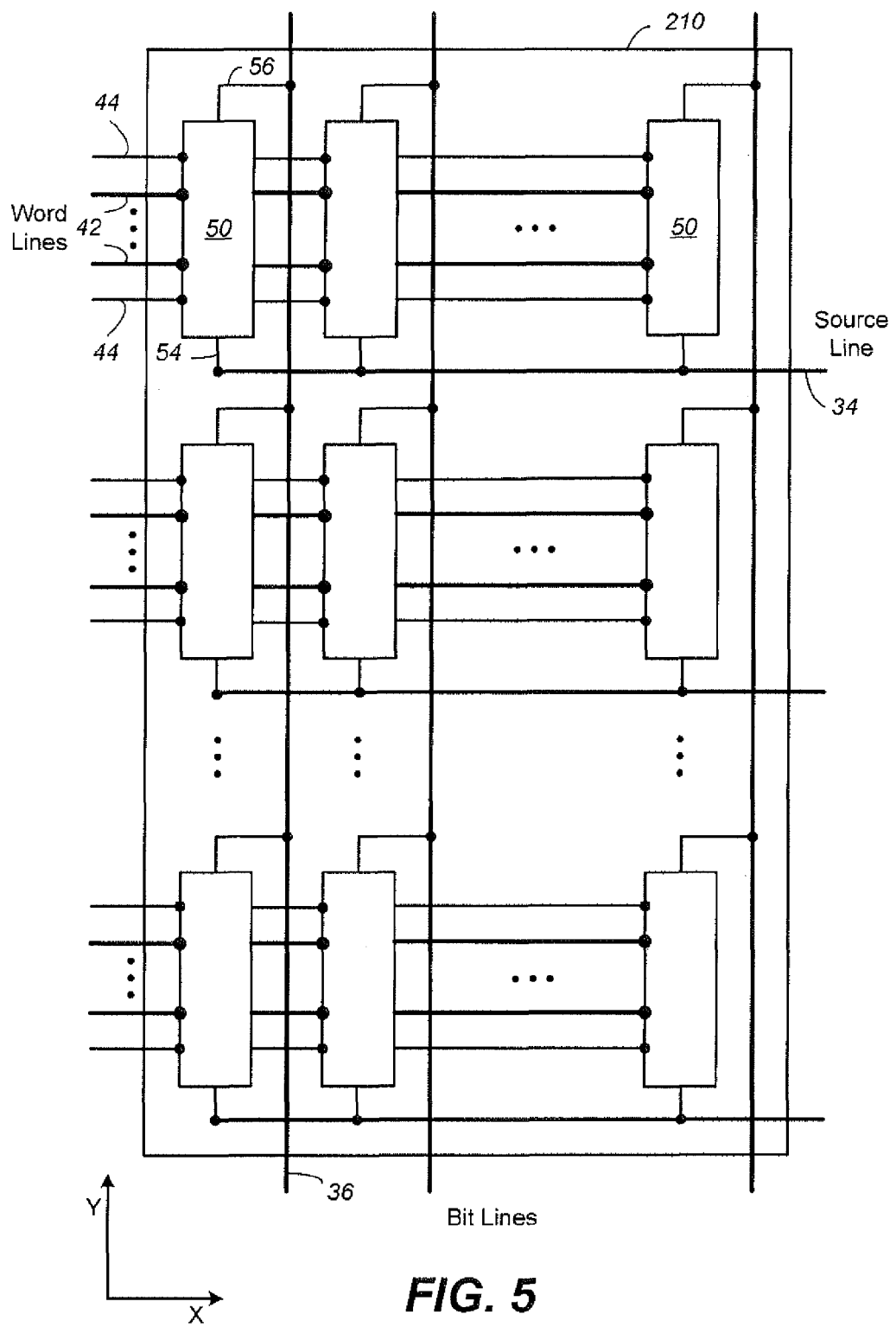
FIG. 5 illustrates an example of a NAND array 210 of memory cells, constituted from NAND strings 50 such as that shown in FIG. 4.
Figure 6:
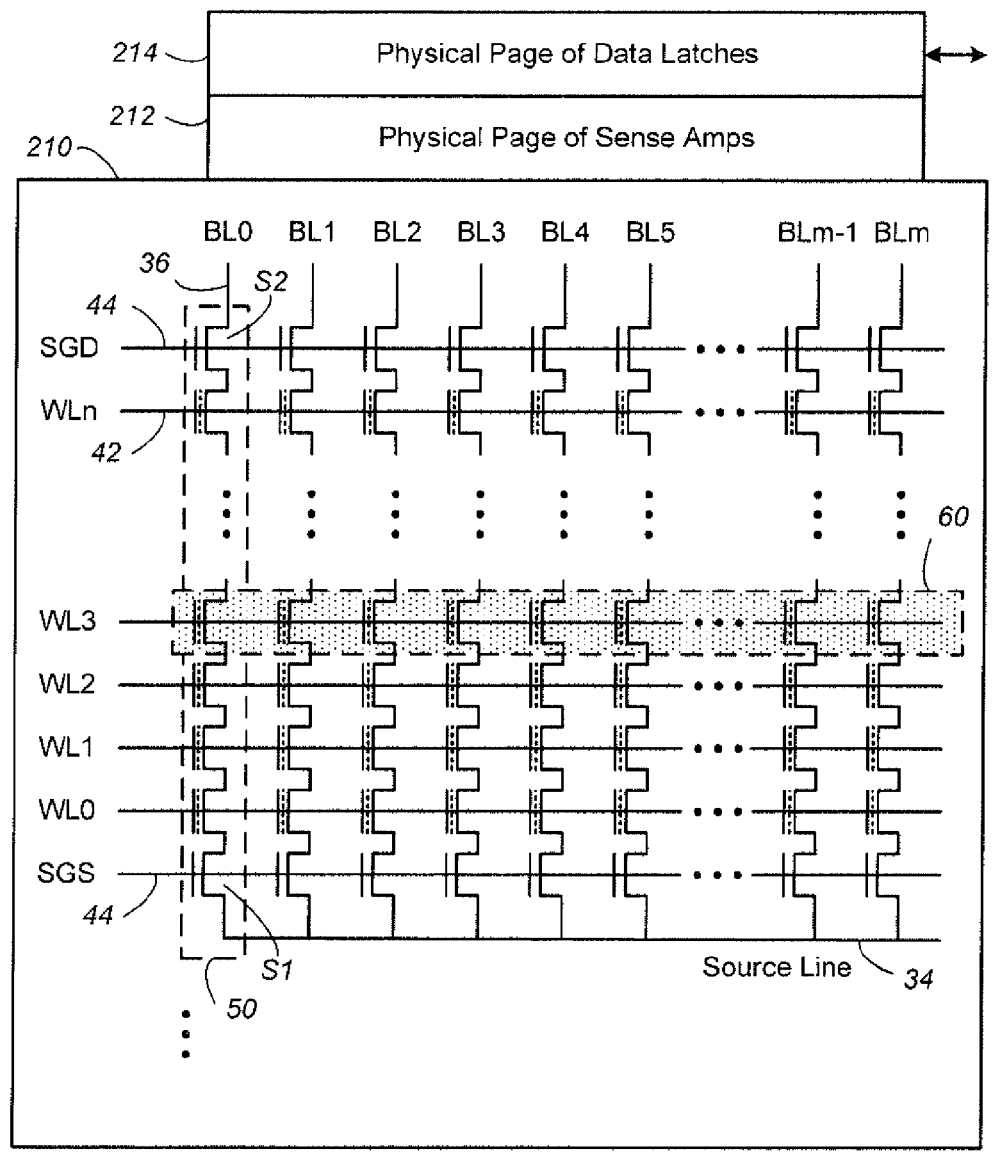
FIG. 6 illustrates a page of memory cells, organized in the NAND configuration, being sensed or programmed in parallel.

FIG. 6 illustrates a page of memory cells, organized in the NAND configuration, being sensed or programmed in parallel. FIG. 6 essentially shows a bank of NAND strings 50 in the memory array 210 of FIG. 5, where the detail of each NAND string is shown explicitly as in FIG. 4. A physical page, such as the page 60, is a group of memory cells enabled to be sensed or programmed in parallel. This is accomplished by a corresponding page of sense amplifiers 212. The sensed results are latched in a corresponding set of latches 214. Each sense amplifier can be coupled to a NAND string via a bit line. The page is enabled by the control gates of the cells of the page connected in common to a word line 42 and each cell accessible by a sense amplifier accessible via a bit line 36. As an example, when respectively sensing or programming the page of cells 60, a sensing voltage or a programming voltage is respectively applied to the common word line WL3 together with appropriate voltages on the bit lines.

Physical Organization of the Memory

One difference between flash memory and other of types of memory is that a cell must be programmed from the erased state. That is the floating gate must first be emptied of charge. Programming then adds a desired amount of charge back to the floating gate. It does not support removing a portion of the charge from the floating gate to go from a more programmed state to a lesser one. This means that updated data cannot overwrite existing data and must be written to a previous unwritten location.

Furthermore erasing is to empty all the charges from the floating gate and generally takes appreciable time. For that reason, it will be cumbersome and very slow to erase cell by cell or even page by page. In practice, the array of memory cells is divided into a large number of blocks of memory cells. As is common for flash EEPROM systems, the block is the unit of erase. That is, each block contains the minimum number of memory cells that are erased together. While aggregating a large number of cells in a block to be erased in parallel will improve erase performance, a large size block also entails dealing with a larger number of update and obsolete data.

Each block is typically divided into a number of physical pages. A logical page is a unit of programming or reading that contains a number of bits equal to the number of cells in a physical page. In a memory that stores one bit per cell, one physical page stores one logical page of data. In memories that store two bits per cell, a physical page stores two logical pages. The number of logical pages stored in a physical page thus reflects the number of bits stored per cell. In one embodiment, the individual pages may be divided into segments and the segments may contain the fewest number of cells that are written at one time as a basic programming operation. One or more logical pages of data are typically stored in one row of memory cells. A page can store one or more sectors. A sector includes user data and overhead data.

All-Bit, Full-Sequence MLC Programming

Figure 7:
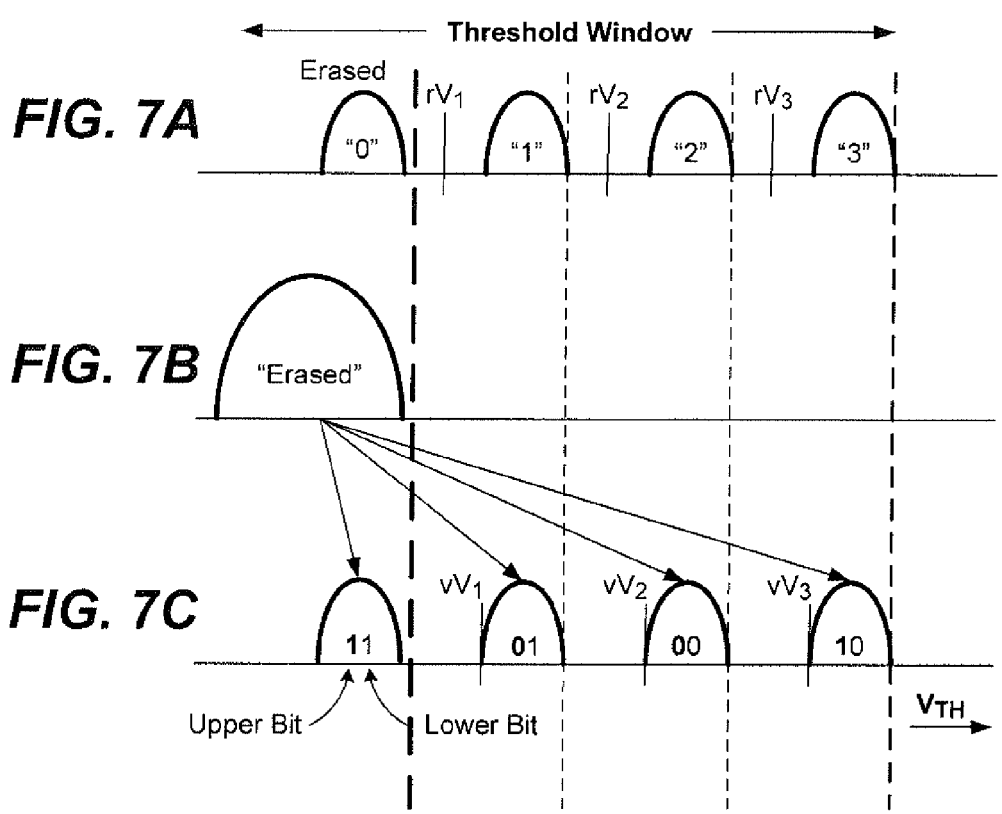
FIGS. 7A-7C illustrate an example of programming a population of memory cells.

FIG. 7A-7C illustrate an example of programming a population of 4-state memory cells. FIG. 7A illustrates the population of memory cells programmable into four distinct distributions of threshold voltages respectively representing memory states "0", "1", "2" and "3". FIG. 7B illustrates the initial distribution of "erased" threshold voltages for an erased memory. FIG. 6C illustrates an example of the memory after many of the memory cells have been programmed. Essentially, a cell initially has an "erased" threshold voltage and programming will move it to a higher value into one of the three zones demarcated by verify levels $vV_1$, $vV_2$ and $vV_3$. In this way, each memory cell can be programmed to one of the three programmed states "1", "2" and "3" or remain un-programmed in the "erased" state. As the memory gets more programming, the initial distribution of the "erased" state as shown in FIG. 7B will become narrower and the erased state is represented by the "0" state.

A 2-bit code having a lower bit and an upper bit can be used to represent each of the four memory states. For example, the "0", "1", "2" and "3" states are respectively represented by "11", "01", "00" and "10". The 2-bit data may be read from the memory by sensing in "full-sequence" mode where the two bits are sensed together by sensing relative to the read demarcation threshold values $rV_1$, $rV_2$ and $rV_3$ in three sub-passes respectively.

3-D NAND Structures

An alternative arrangement to a conventional two-dimensional (2-D) NAND array is a three-dimensional (3-D) array. In contrast to 2-D NAND arrays, which are formed along a planar surface of a semiconductor wafer, 3-D arrays extend up from the wafer surface and generally include stacks, or columns, of memory cells extending upwards. Various 3-D arrangements are possible. In one arrangement a NAND string is formed vertically with one end (e.g. source) at the wafer surface and the other end (e.g. drain) on top. In another arrangement a NAND string is formed in a U-shape so that both ends of the NAND string are accessible on top, thus facilitating connections between such strings.

Figure 8:
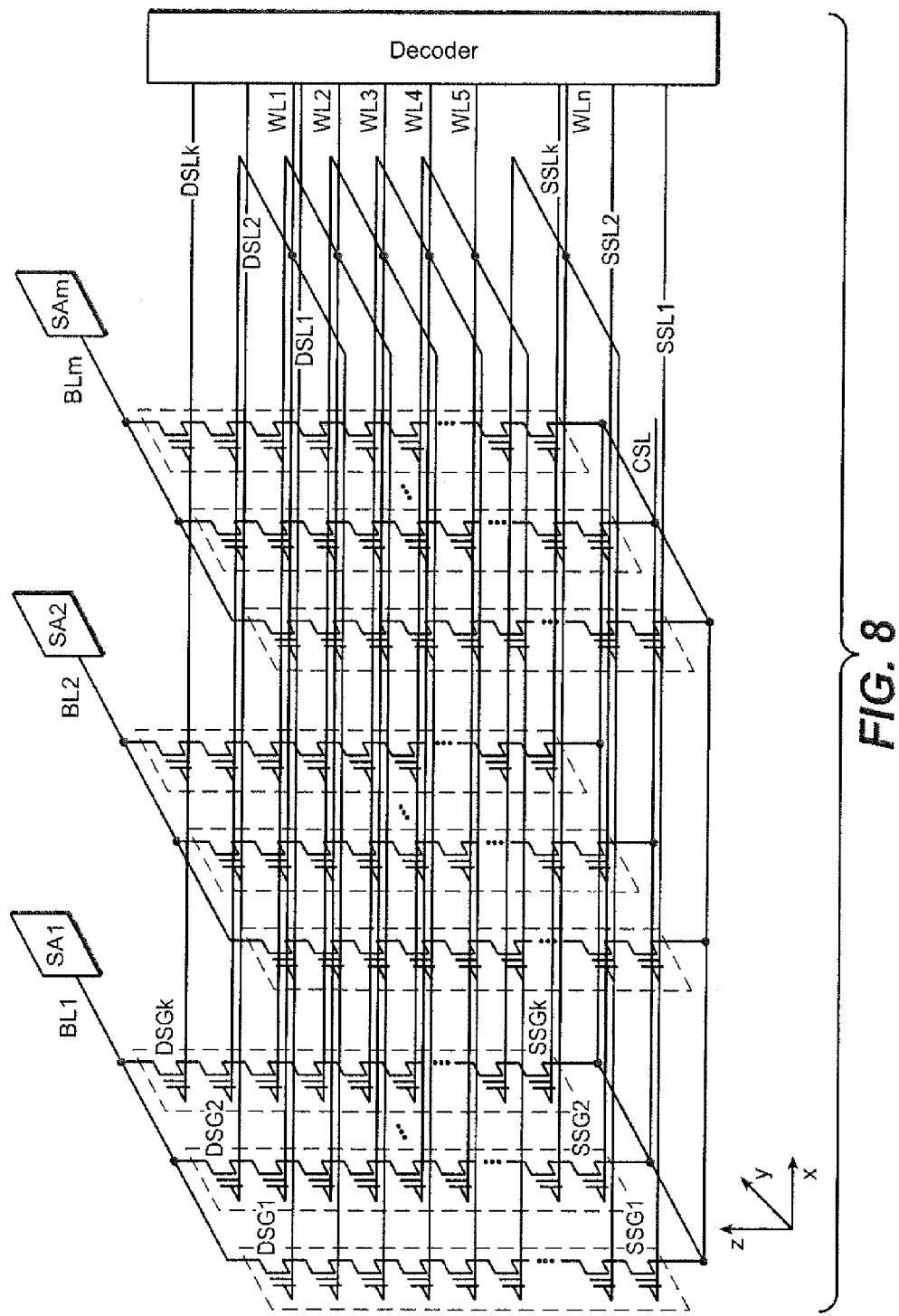
FIG. 8 shows an example of a physical structure of a 3-D NAND string.

FIG. 8 shows a first example of a NAND string 701 that extends in a vertical direction, i.e. extending in the z-direction, perpendicular to the x-y plane of the substrate. Memory cells are formed where a vertical bit line (local bit line) 703 passes through a word line (e.g. WL0, WL1, etc.). A charge trapping layer between the local bit line and the word line stores charge, which affects the threshold voltage of the transistor formed by the word line (gate) coupled to the vertical bit line (channel) that it encircles. Such memory cells may be formed by forming stacks of word lines and then etching memory holes where memory cells are to be formed. Memory holes are then lined with a charge trapping layer and filled with a suitable local bit line/channel material (with suitable dielectric layers for isolation).

As with planar NAND strings, select gates 705, 707, are located at either end of the string to allow the NAND string to be selectively connected to, or isolated from, external elements 709, 711. Such external elements are generally conductive lines such as common source lines or bit lines that serve large numbers of NAND strings. Vertical NAND strings may be operated in a similar manner to planar NAND strings and both SLC and MLC operation is possible. While FIG. 8 shows an example of a NAND string that has 32 cells (0-31) connected in series, the number of cells in a NAND string may be any suitable number. Not all cells are shown for clarity. It will be understood that additional cells are formed where word lines 3-29 (not shown) intersect the local vertical bit line.

A 3D NAND array can, loosely speaking, be formed tilting up the respective structures 50 and 210 of FIGS. 5 and 6 to be perpendicular to the x-y plane. In this example, each y-z plane corresponds to the page structure of FIG. 6, with m such plane at differing x locations. The (global) bit lines, BL1-m, each run across the top to an associated sense amp SA1-m. The word lines, WL1-n, and source and select lines SSL1-n and DSL1-n, then run in x direction, with the NAND string connected at bottom to a common source line CSL.

Figure 9:
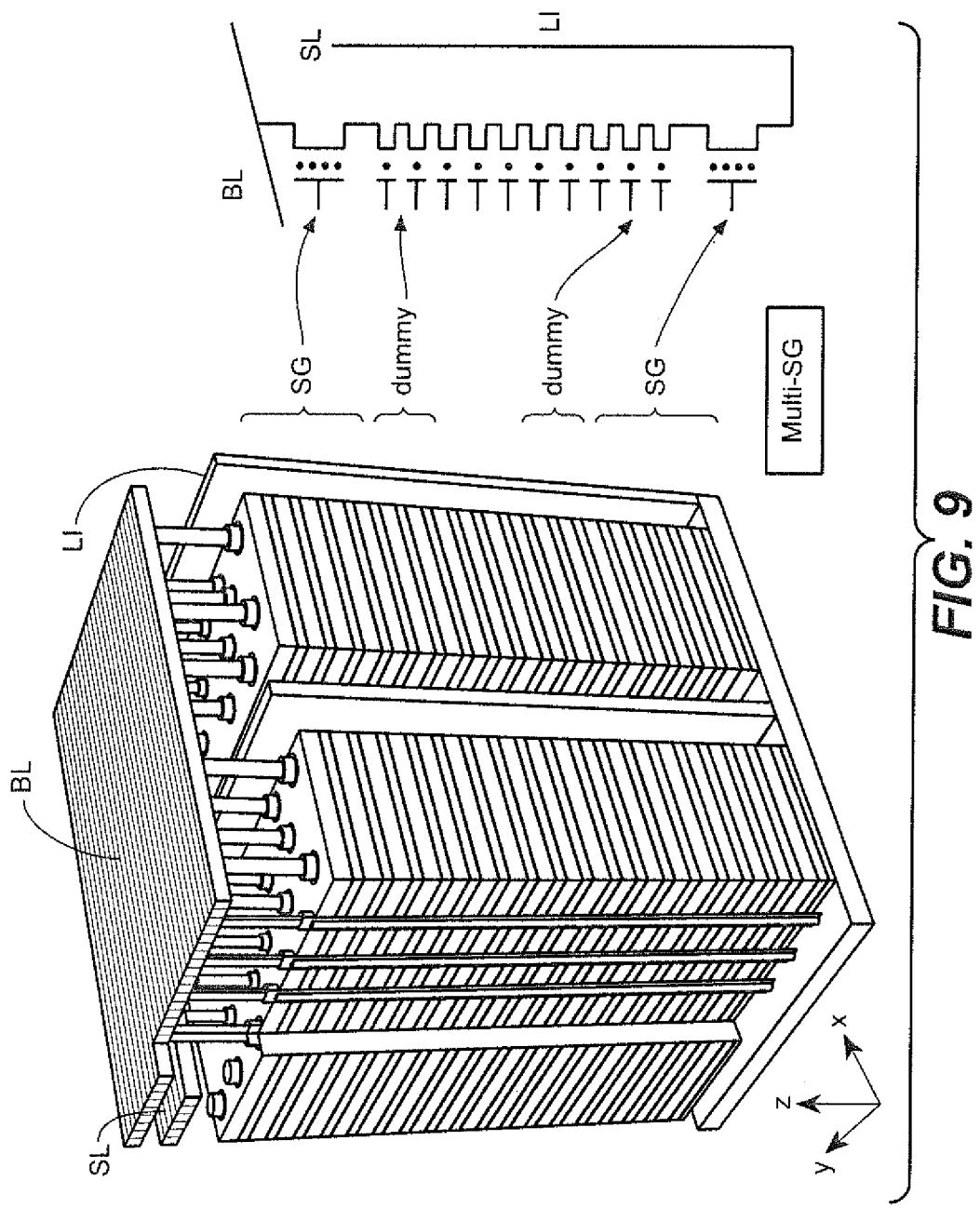
FIGS. 9-12 look at a particular monolithic three dimensional (3D) memory array of the NAND type (more specifically of the "BiCS" type).

FIGS. 9-12 look at a particular monolithic three dimensional (3D) memory array of the NAND type (more specifically of the "BiCS" type), where one or more memory device levels are formed above a single substrate, in more detail. FIG. 9 is an oblique projection of part of such a structure, showing a portion corresponding to two of the page structures in FIG. 5, where, depending on the embodiment, each of these could correspond to a separate block or be different "fingers" of the same block. Here, instead to the NAND strings lying in a common y-z plane, they are squashed together in the y direction, so that the NAND strings are somewhat staggered in the x direction. On the top, the NAND strings are connected along global bit lines (BL) spanning multiple such sub-divisions of the array that run in the x direction. Here, global common source lines (SL) also run across multiple such structures in the x direction and are connect to the sources at the bottoms of the NAND string, which are connected by a local interconnect (LI) that serves as the local common source line of the individual finger. Depending on the embodiment, the global source lines can span the whole, or just a portion, of the array structure. Rather than use the local interconnect (LI), variations can include the NAND string being formed in a U type structure, where part of the string itself runs back up.

To the right of FIG. 9 is a representation of the elements of one of the vertical NAND strings from the structure to the left. Multiple memory cells are connected through a drain select gate SGD to the associated bit line BL at the top and connected through the associated source select gate SDS to the associated local source line LI to a global source line SL. It is often useful to have a select gate with a greater length than that of memory cells, where this can alternately be achieved by having several select gates in series (as described in U.S. patent application Ser. No. 13/925,662, filed on Jun. 24, 2013), making for more uniform processing of layers. Additionally, the select gates are programmable to have their threshold levels adjusted. This exemplary embodiment also includes several dummy cells at the ends that are not used to store user data, as their proximity to the select gates makes them more prone to disturbs.

Figure 10:
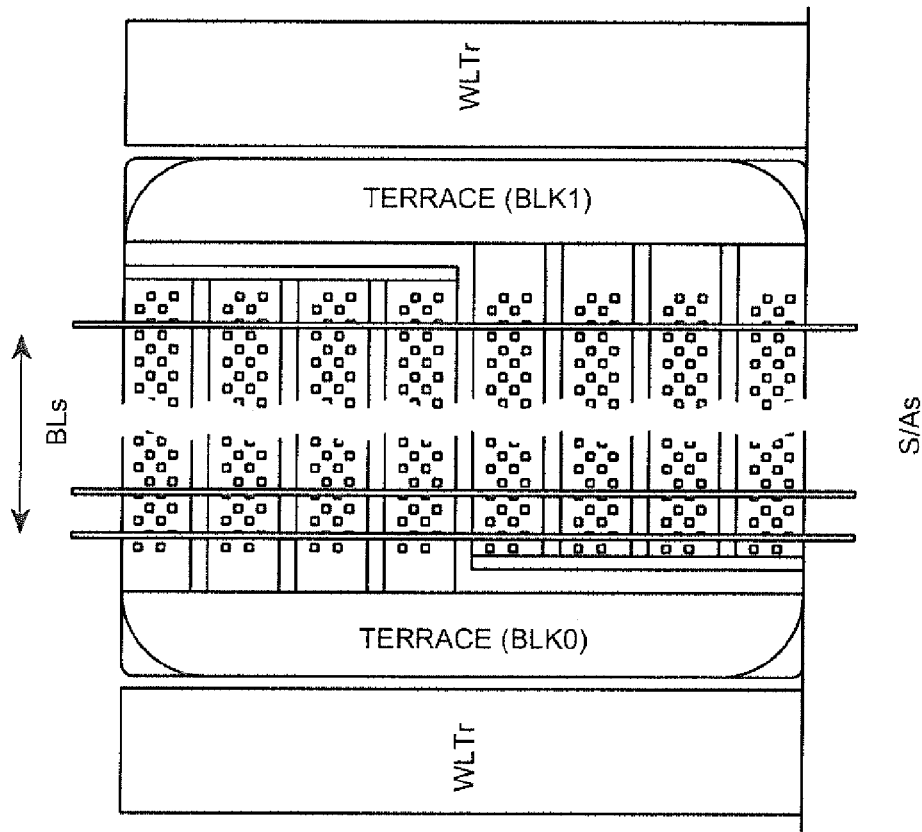

FIG. 10 shows a top view of the structure for two blocks in the exemplary embodiment. Two blocks (BLK0 above, BLK1 below) are shown, each having four fingers that run left to right. The word lines and select gate lines of each level also run left to right, with the word lines of the different fingers of the same block being commonly connected at a "terrace" and then on to receive their various voltage level through the word line select gates at WLTr. The word lines of a given layer in a block can also be commonly connected on the far side from the terrace. The selected gate lines can be individual for each level, rather common, allowing the fingers to be individually selected. The bit lines are shown running up and down the page and connect on to the sense amp circuits, where, depending on the embodiment, each sense amp can correspond to a single bit line or be multiplexed to several bit lines.

Figure 11:
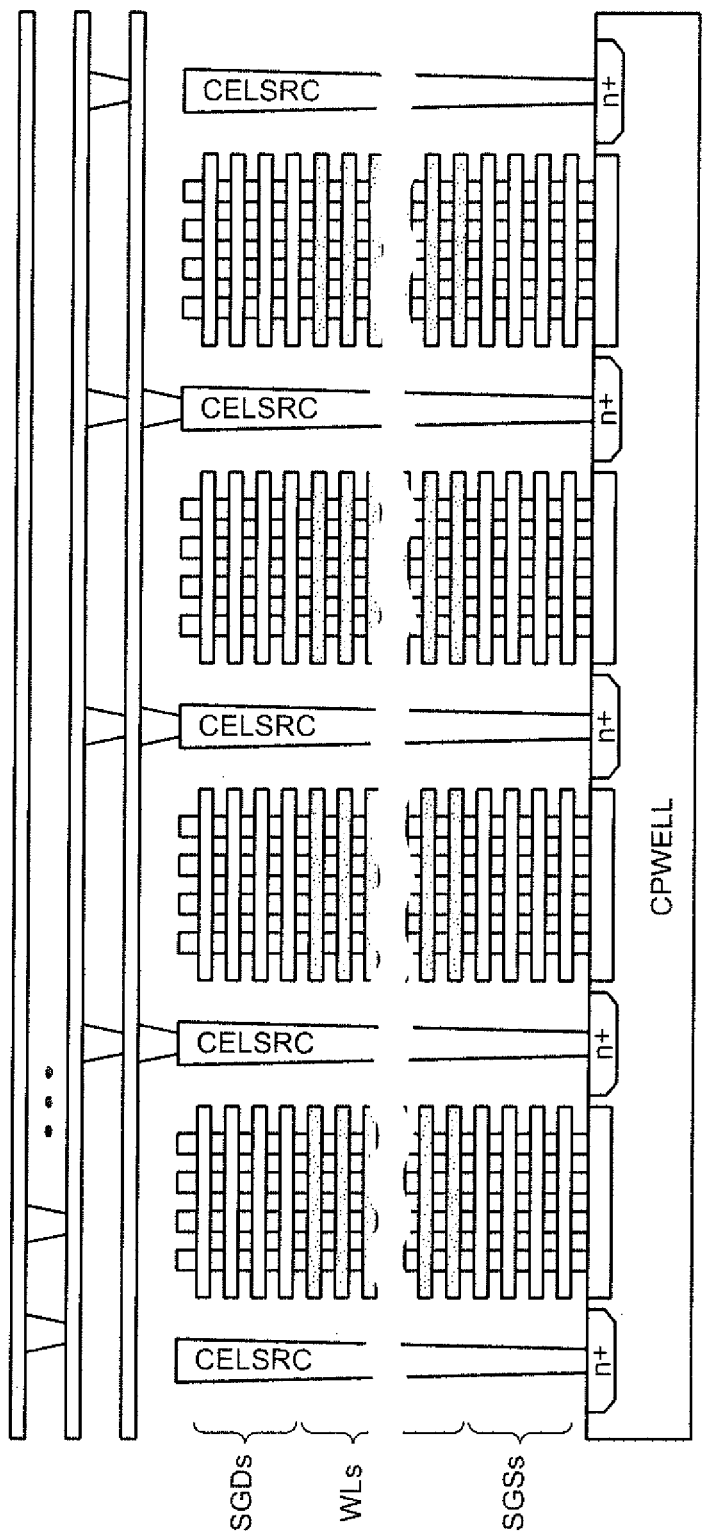

FIG. 11 shows a side view of one block, again with four fingers. In this exemplary embodiment, the select gates SGD and SGS at either end of the NAND strings are formed of four layers, with the word lines WL in-between, all formed over a CPWELL. A given finger is selected by setting its select gates to a level VSG and the word lines are biased according to the operation, such as a read voltage (VCGRV) for the selected word lines and the read-pass voltage (VREAD) for the non-selected word lines. The non-selected fingers can then be cut off by setting their select gates accordingly.

Figure 12:
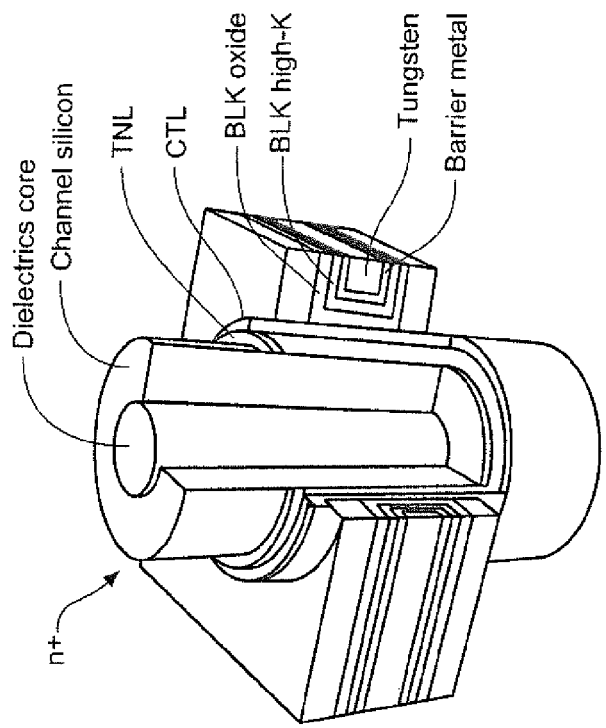

FIG. 12 illustrates some detail of an individual cell. A dielectric core runs in the vertical direction and is surrounded by a channel silicon layer, that is in turn surrounded a tunnel dielectric (TNL) and then the charge trapping dielectric layer (CTL). The gate of the cell is here formed of tungsten with which is surrounded by a metal barrier and is separated from the charge trapping layer by blocking (BLK) oxide and a high K layer.

Bulk Driven Low Swing Driver

This section looks at the transmission of signals on integrated circuits. Although much more generally applicable, the discussion is placed in the context of non-volatile memory circuits, such as those described above, in order to provide concrete examples.

Figure 13:
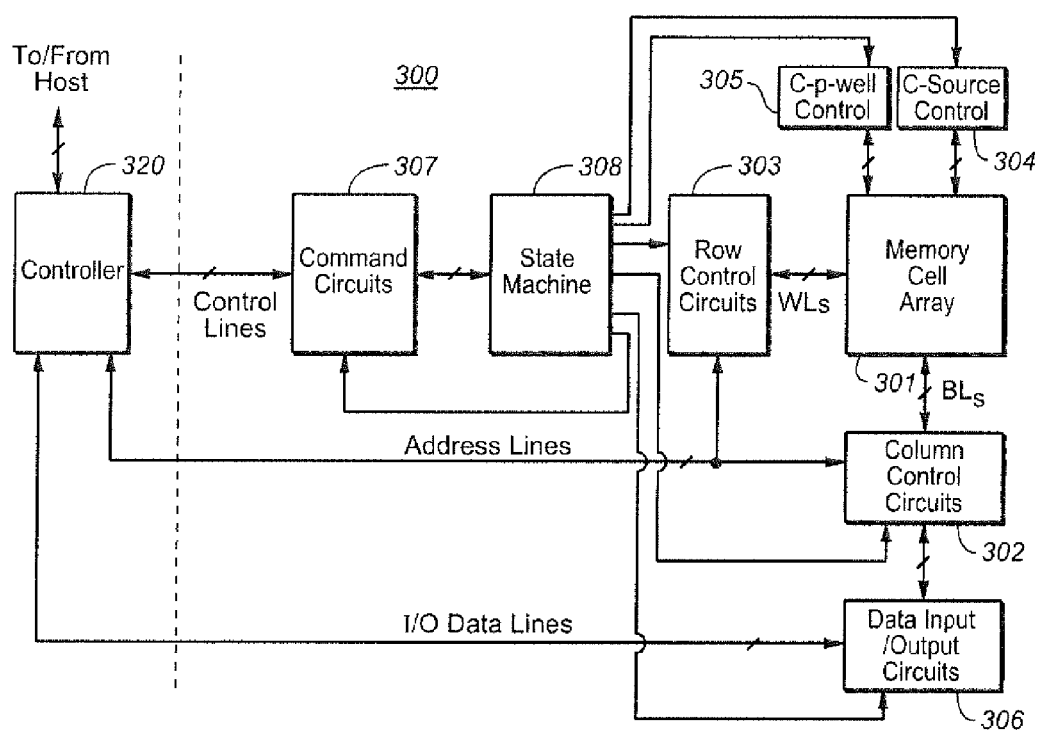
FIG. 13 illustrates some of the elements typically found on a memory circuit.

FIG. 13 is a schematic representation of a memory system to illustrate some of the elements typically found on a memory circuit and between which signals would be transmitted. To the left of the broken line in a controller 320 and to the right a memory chip 300, including an array 301 that can be one of those such as are described above. In this representation, the control, address, and I/O data lines are shown separated out. After being received on the memory chip 300, data is transmitted to the data input/output circuits 306, on to the column control circuits 302, and then on to the array 301, with the data moving in the other direction when read out to the controller. The addresses are transmitted between the controller and the column control circuits 302 and the row control circuits. Control signals are transferred between the memory's controller interface and the command circuits 307; between the command circuits 307 and state machine 308; and from the state machine to the various control circuits (302, 303, 304, 305) used in operations on the array. The particulars will vary with the embodiment, but this gives a general idea of some of the elements involved.

Figure 14:
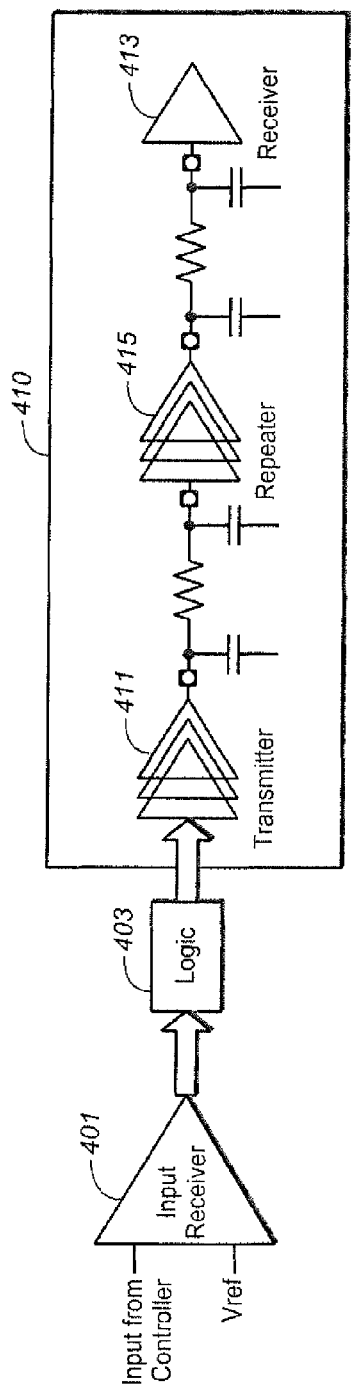
FIG. 14 is a schematic representation of a signal path using a transmitter, repeater, and receiver.

FIG. 14 is a schematic representation of one such signal path. An input signal from the controller is received at the input receiver 401, also having reference voltage input, and supplied on to the logic block 403, which in turn generates the (digital) signal to be transmitted to one of the other blocks on the circuit by block 410. A transmitter 411, such as a series of inverters transmits the signal to a receiver 413, here a single inverter. The intervening path is represented as series of resistances and capacitances. To maintain the signal over the path, one or more repeaters 415 are used. Among the priorities for such a circuit are performance (jitter, skew), power consumption, and area. The main goal in this section is to reduce power consumption in this block without affecting performance. In transmitting a digital of amplitude between ground and Vdd at a frequency f is $P_{avg} = \frac{1}{2} C V_{dd}^2 f$, were C is the capacitance along the path. As C is a factor of the path and it is not wanted to drop the frequency, two ways to reduce power consumption are to either to reduce the supply level Vdd, which is typically not practical as this level is widely used across the device, or to reduce the voltage swing of the block 401.

Figure 15:
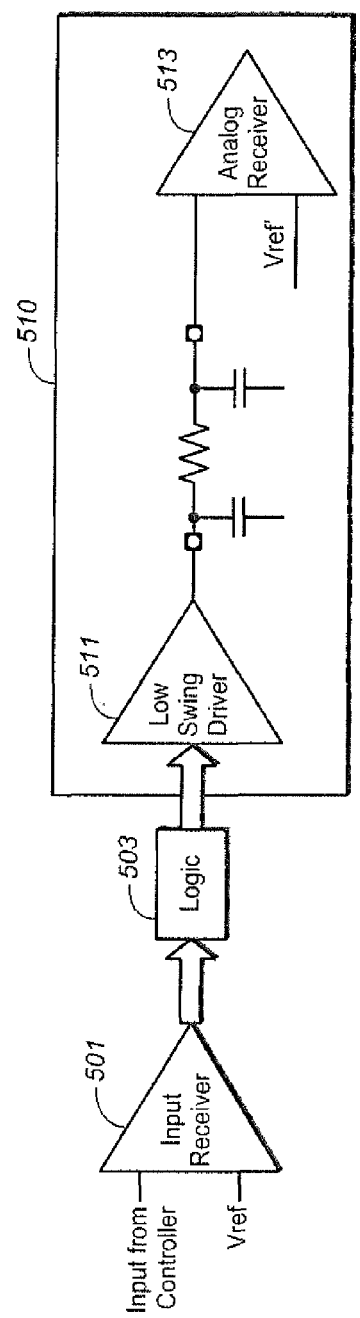
FIG. 15 is an exemplary embodiment of a low swing driver circuit.

To reduce power consumption while transmitting high speed signals across a long length of wire, without affecting performance, the exemplary embodiments of this section reduce the voltage swing along the transmission path. More specifically, a low swing driver (for example, of 300 mV relative to a Vdd of ~2V) is used with an analog receiver, without need an intervening repeater. This is illustrated in FIG. 15: The input driver 501 receives the input from the controller and a reference voltage Vref, which in this arrangement may differ from that of FIG. 14, and provides the signal to the logic block 503, which in turn supplies the (digital) signal to be transmitted to the block 510. The driver 511 will provide the low swing signal through the path to the analog receiver 513. The embodiment of FIG. 15 uses a one sided embodiment, where the second input of the analog receiver is a reference value Vref' whose generation is discussed below. As also discussed below, a differential embodiment can be used.

Figure 16:
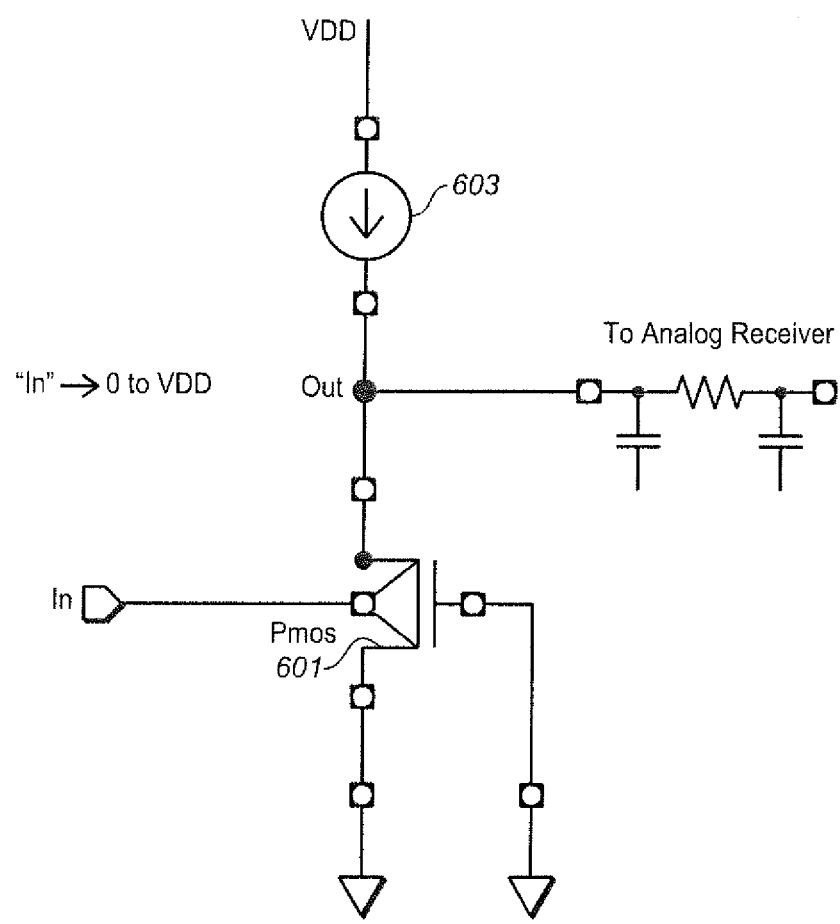
FIG. 16 illustrates an exemplary transmitter arrangement.

FIG. 16 shows an exemplary embodiment for the transmitter of the low swing driver. A fixed value current source Idc 603 is connected between Vdd and the output node that supplies the signal wire. A PMOS 601 is connected between the out node and ground. The gate of PMOS 601 is also connected to ground. The input is connected to the bulk input of PMOS 601 and modulates the devices threshold voltage, and thus the output voltage. The digital input has values of 0V and Vdd. The output will swing between the low value Vol and the high value Voh. Under this arrangement, as Vin increases the threshold of PMOS 601 and, consequently Vout, increasing in an almost linear manner. For example, an input signal with Vdd~2V will lead to an output swing of about 300 mV.

Figure 17:
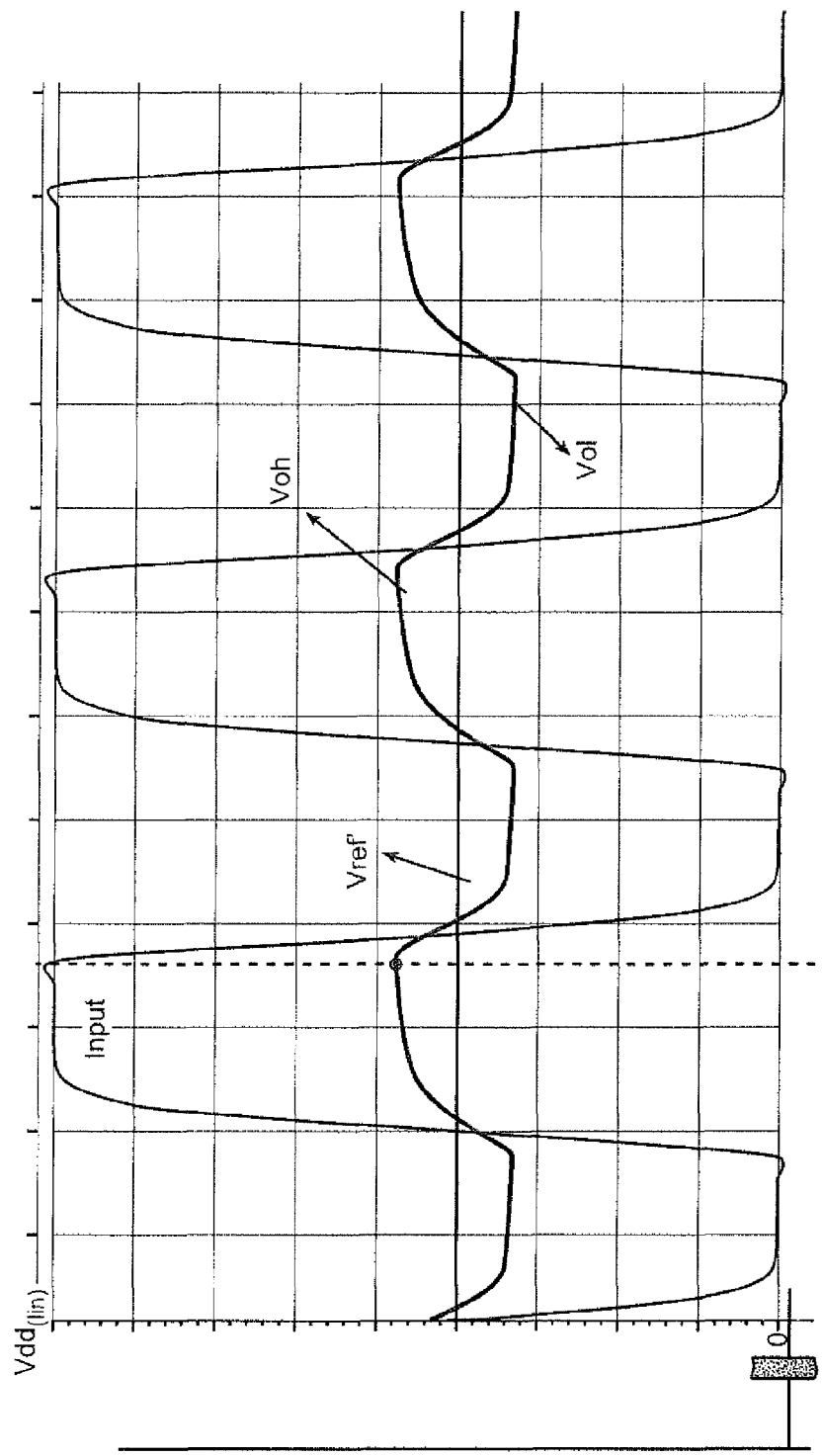
FIG. 17 looks at input and output waveforms of the transmitter of FIG. 16.

FIG. 17 looks at typical input and output waveforms of the transmitter of FIG. 16. As shown, the input is taken as a series of alternate "0" (ground) and "1" (Vdd=~2V, in this example) values. The output values alternate between corresponding high value Voh and low value Vol. To properly differentiate these values, the receivers reference value reference value Vref needs to be set near the center of this swing, which will typically not be centered around Vdd/2.

Figure 18:
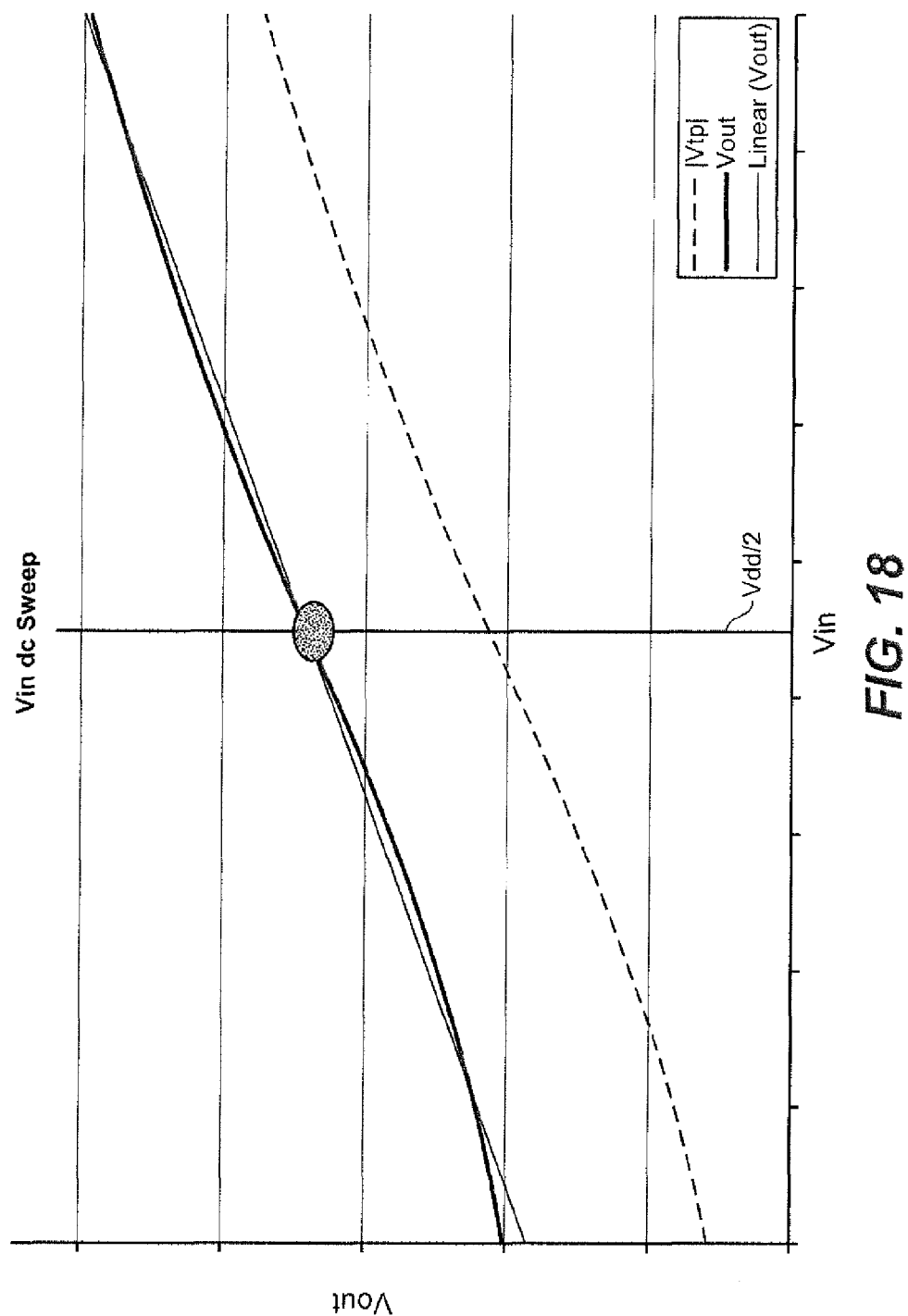
FIG. 18 illustrates a technique for generating a receiver reference voltage.
Figure 19:
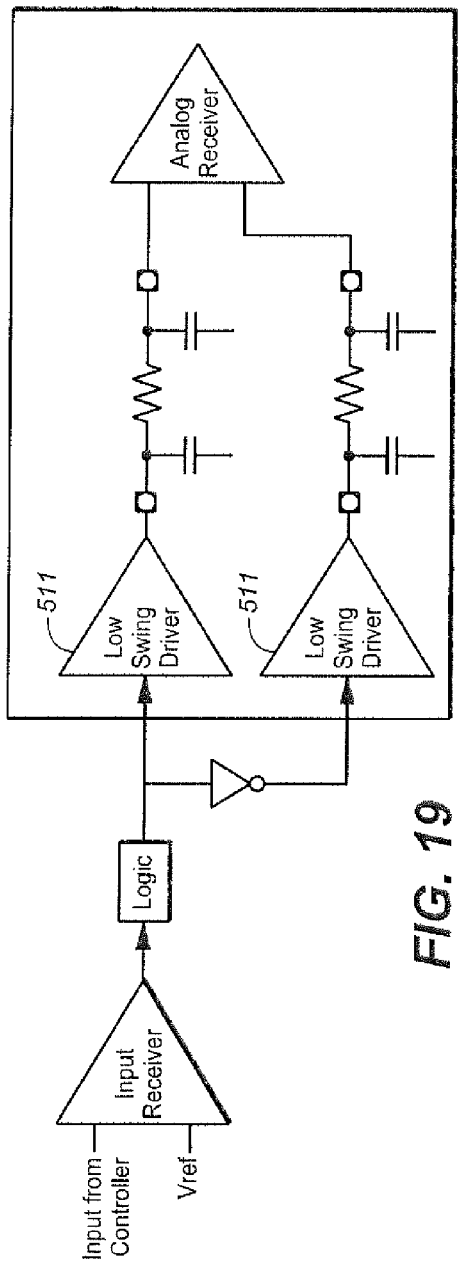
FIG. 19 illustrates an alternate, differential embodiment.

Consequently, the reference voltage value Vref for the analog receiver 513 in the single ended analogue input arrangement of FIG. 15 needs to be set appropriately to track with the swing across all PVT corners. This can be achieved by using a PMOS arranged similarly to the transmitter driver of FIG. 16, but with the input set to Vdd/2 (the midpoint of Vin for the transmitter of FIG. 16), providing an output at the midpoint of transmitter's swing. This is illustrated in FIG. 18 that shows the threshold voltage and output voltage of a PMOS connected as in FIG. 16. Although the threshold voltage and output voltage are not completely linear with the Vin value, they do track relatively closely; and for applications where speed and simplicity is of importance, these may provide sufficient accuracy to generate the reference voltage for the differential amplifier at receiver. One can sweep the bulk voltage, plot the output vs input transfer characteristics and decide whether the linearity is sufficient enough to meet performance. If not, one can opt for the differential version, such as illustrated in FIG. 19.

The exemplary embodiment of FIG. 15 uses a single ended transmitter to reduce complexity, area and power. For higher performance, improved accuracy or both, a differential arrangement can also be used. In a differential arrangements, a pair of transmitters as in FIG. 16 can be used, one for the input and one for the inverted input. Both signals are then transmitted to the receiver, one for each input of receiver's differential amplifier, as is illustrated in FIG. 19.

Figure 20:
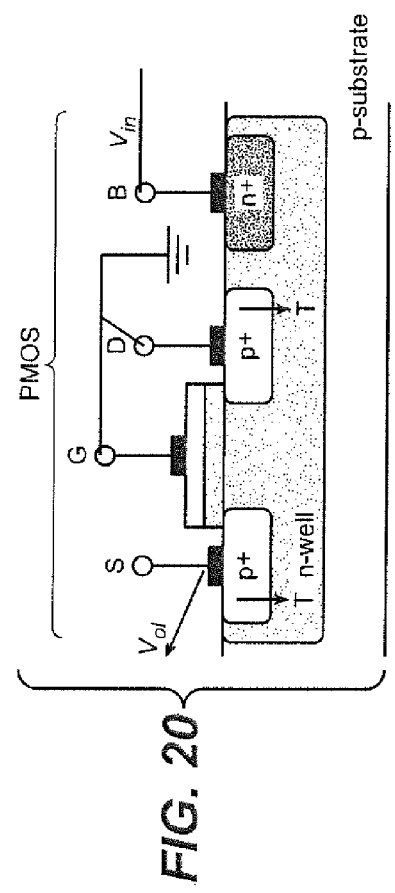
FIG. 20 shows a PMOS device connected as in FIG. 16.

One possible concern of the arrangement illustrated with respect to FIG. 16 is forward biasing of the PMOS when the bulk is at the low input value. FIG. 20 illustrates the situation. This shows a PMOS device whose gate and drain are set to ground, the input voltage is applied to the bulk and the output is taken from the source. When Vin is at VDD, there is no forward biasing concern. However, when Vin is at ground and source is at Vol, the source-bulk P-N junction is forward biased. This issue can be mitigated by using standard latchup protection like a guard ring.

The techniques of the section are described further in US patent publication number 2016-0204783.

Bulk Modulation Scheme to Reduce Pin Capacitance

The preceding section looks at the transmission of signals on an integrated circuit. This section looks at transmitting signals off of circuit. More specifically, it presents a scheme to reduce the capacitance of a driver circuit, allowing for higher speed operation. Although described primarily in the context of a driver circuit for an input/output pin of non-volatile memory, the technique can be applied more generally to driver circuits.

To provide context for the exemplary embodiment of an off-chip driver (OCD) (i.e., a driver on the memory chip to drive the signal going off of the chip), going back to FIG. 13, this shows a memory system with a controller 320 and a memory circuit 300. FIG. 13 shows only a single memory chip, but a memory system will typically have a number of such chips connected to a controller over a bus structure, one at a time being enabled to drive off of the chip, where the figure illustrates examples of the lines on the bus structure. When sending a signal off-chip, a driver on the chip will drive the corresponding bus line through the chip's pin.

Figure 21:
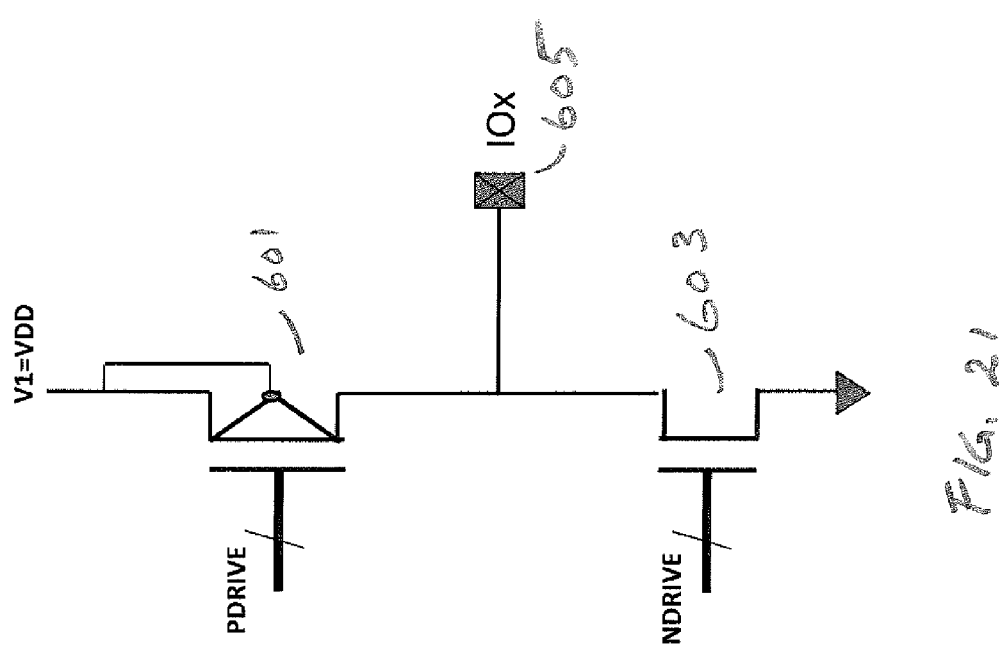
FIG. 21 is an example of a circuit used as an off-chip driver.

FIG. 21 illustrates an example of a circuit used as an off-chip driver. PMOS 601 and NMOS 603 and connected in series between an on chip-supply level V1 and ground. The output supplied to an input/output pin IOx is taken from the node between the two transistors and the control gates are driven by the signals NDRIVE and PDRIVE, where here these are from the same input signal supplied through corresponding drive circuits, but in other applications could be independently generated signals.

The capacitance $C_{pin}$ on the pin will limit the speed at which the driver can operate. This capacitance tends to be dominated by parasitic capacitance of the driver, along with other transistors, I/O pad and circuitry associated with the pin. This effect is multiplied by the number of chips connected along a transmission line: for example, in a topology stacking 8 dies in multi-die package, the $C_{pin}$ value will correspondingly increase. This can make it difficult for multi-die packages to meet interface speed standards. Of the elements contributing to $C_{pin}$, the capacitances of the NMOS and PMOS transistors in the drivers are generally the largest contribution, where in a typical driver such as illustrated in FIG. 21 the PMOS contribution is roughly twice that of the NMOS; and the wider the device, and the greater the device width (as needed for drive requirements), the higher the capacitance of the individual devices. If the parasitic capacitance of the driver can be reduced, the total pin capacitance will be reduced and the device read rate can be increased.

Pin capacitance of the driver can be reduced by using low threshold voltage Vth and short channel length devices. Decreasing device length and Vth can allow for use of devices of less width, decreasing $C_{pin}$. However, this comes at the cost of leakage current Ioff when the device is off. For example, using low threshold and short channel length devices may increase Ioff during standby mode by 3 to 10 times. In an active mode, when the driver is transmitting a signal, this may be an acceptable small increase in current, but not acceptable when the device is in standby.

Figure 22:
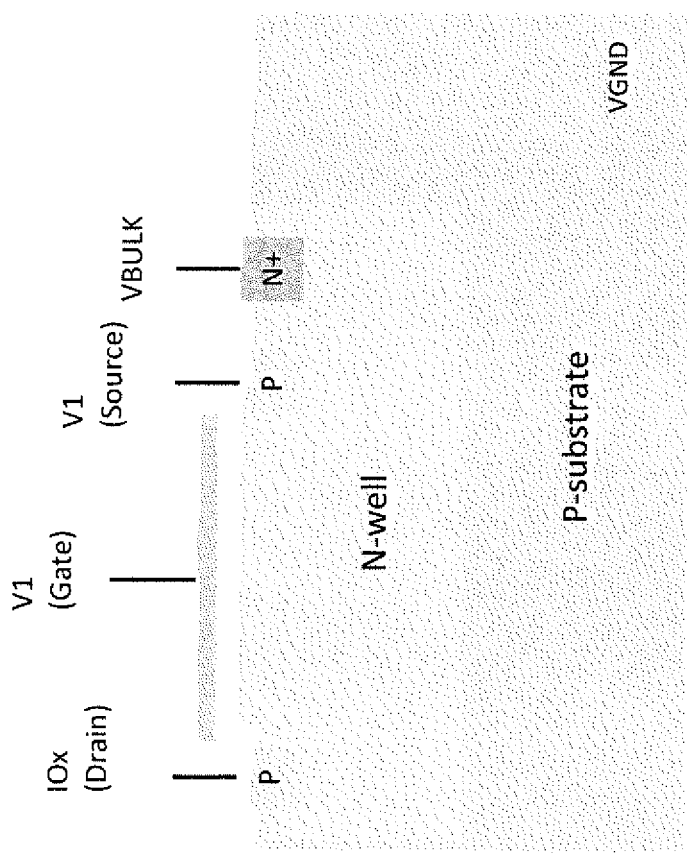
FIG. 22 illustrates a PMOS with an N-well formed within the P-substrate.

To overcome the leakage current problem, the exemplary embodiments use a bulk modulation scheme. FIG. 22 illustrates a PMOS, where the device's N-well is formed within the P-substrate. The P regions of the drain and source are then formed in the N-well, as is the N+ bulk or body connection, with the gate formed over the channel region. As illustrated in the driver of FIG. 21, in the usual PMOS usage the body connection of the bulk terminal is commonly connected with the source. By instead modulating the bulk voltage of device, threshold voltage of device can be changed and leakage current can be changed. By increasing VBULK to a voltage higher than the source V1 when the device is off in standby mode, Vth will be increased and Ioff will be reduced due to body bias effect. In Active mode, VBULK can be connected to source to nullify this body bias effect. As VBULK is not fixed, the PMOS of the driver should a separate N-well compared to other PMOS devices on die. (A similar arrangement could be used for the driver's NMOS, but this will typically not be practical as the NMOS devices of the circuit are formed on the common P-substrate and to make a similar arrangement for the driver's NMOS device, a triple-well fabrication process is needed which adds cost)

Figure 23:
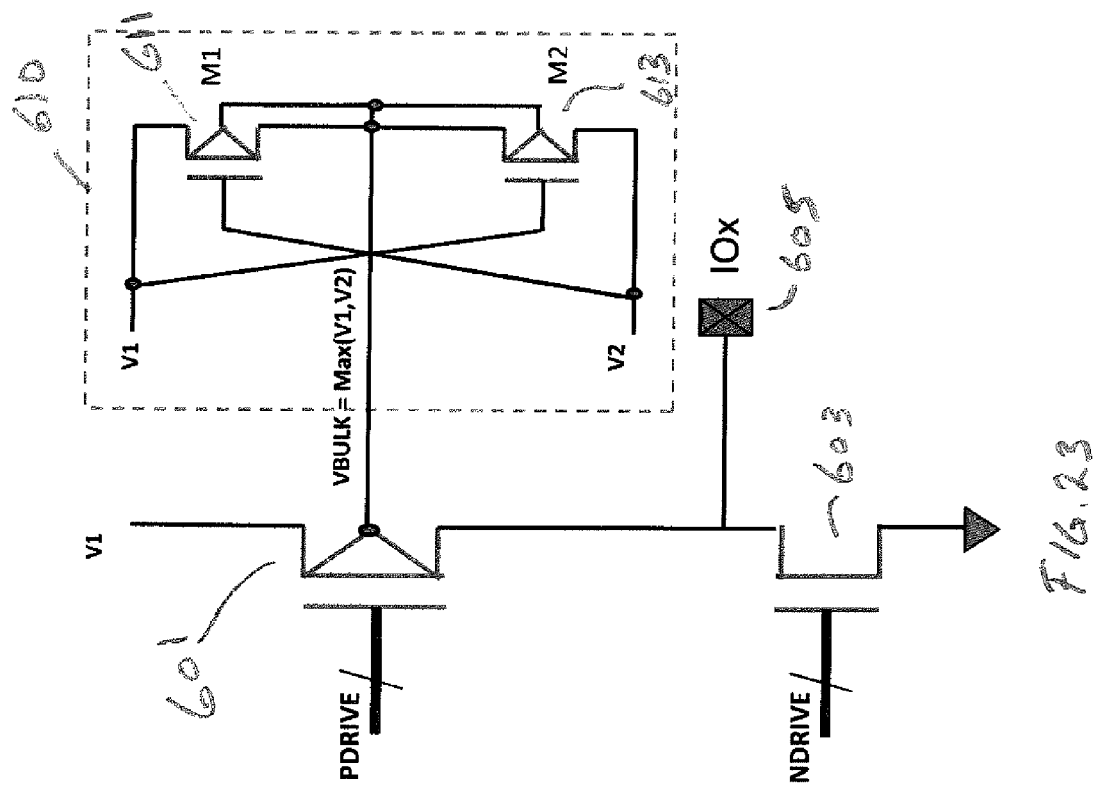
FIG. 23 is an example of a driver using a bulk modulation circuit architecture.

FIG. 23 illustrates an example of a bulk modulation circuit architecture. A driver similar to that of FIG. 21 again uses a PMOS 601 and NMOS 603 connected in series, with the output at IOx 605, but rather than have the body connection of PMOS 601 commonly connected with the source, it now receives a voltage VBULK from a bulk biasing circuit 610. Two PMOSs M1 611 and M2 613 are connected in a cross-coupled configuration for positive feedback, where the transistors are connected in series between V1 and a level V2 with the intermediate node connected to the body terminal to supply VBULK, the gates of M1 611 and M2 613 respectively connected receive V1 and V2. The bulk of PMOS 601 in the driver and bulk of M1 611 and M2 613 are connected together to all receive VBULK. The arrangement is such that in a stand-by mode, circuit 610 sets VBULK=MAX (V1, V2); and in an active mode, the circuit will set VBULK=V1 The stand-by mode and active mode are illustrated in more detail with respect to FIGS. 24 and 25.

Figure 24:
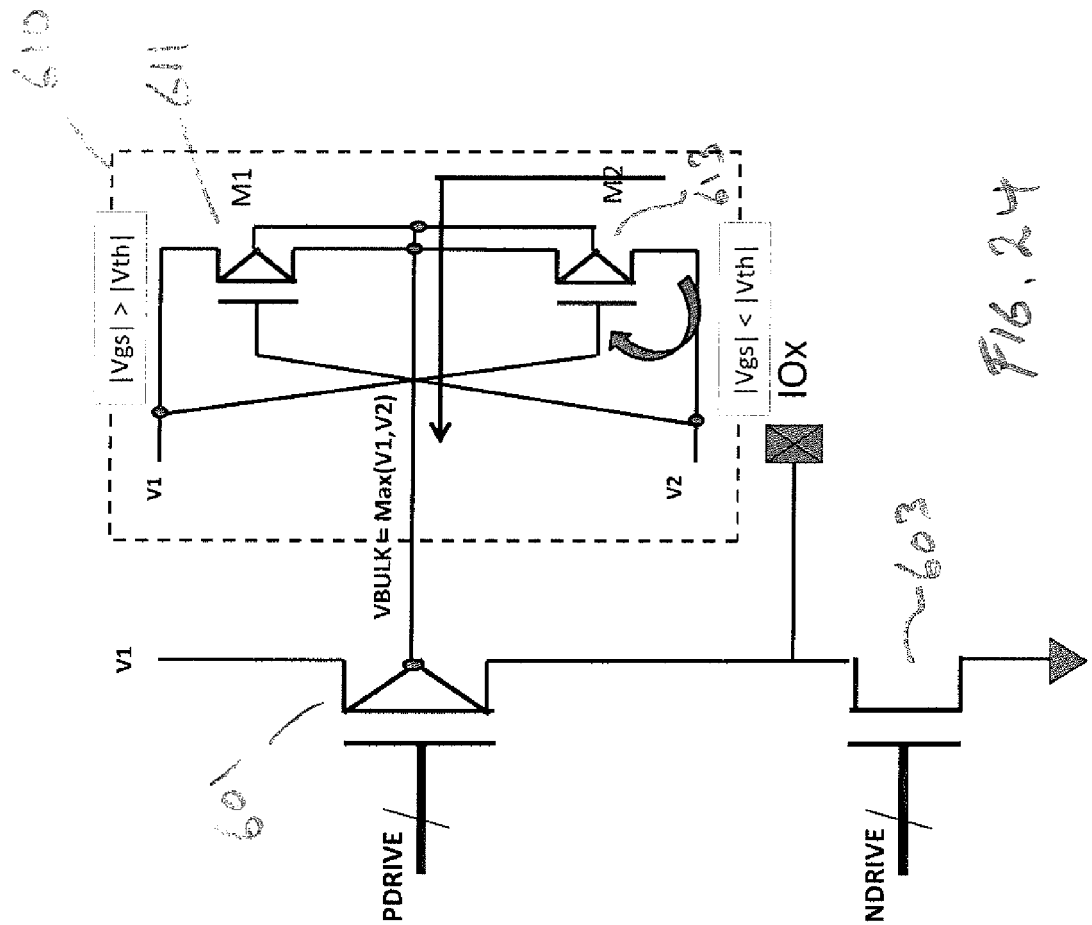
FIGS. 24 and 25 respectively illustrate the operation of FIG. 23 in a stand-by mode and an active mode.

FIG. 24 illustrates the operation in stand-by mode, when V2>V1. M1 611 is turned off and M2 613 is turned on, so that instantaneous current flows through M2 and takes VBULK to V2. As V2>V1, V(bulk-source)>0, which causes the increase in threshold voltage of PMOS 601 significantly and reduces leakage current. Thus, a PMOS 601 with low threshold voltage and short channel length can be used in the driver to reduce pin capacitance and the bulk modulation can reduce leakage current.

Figure 25:
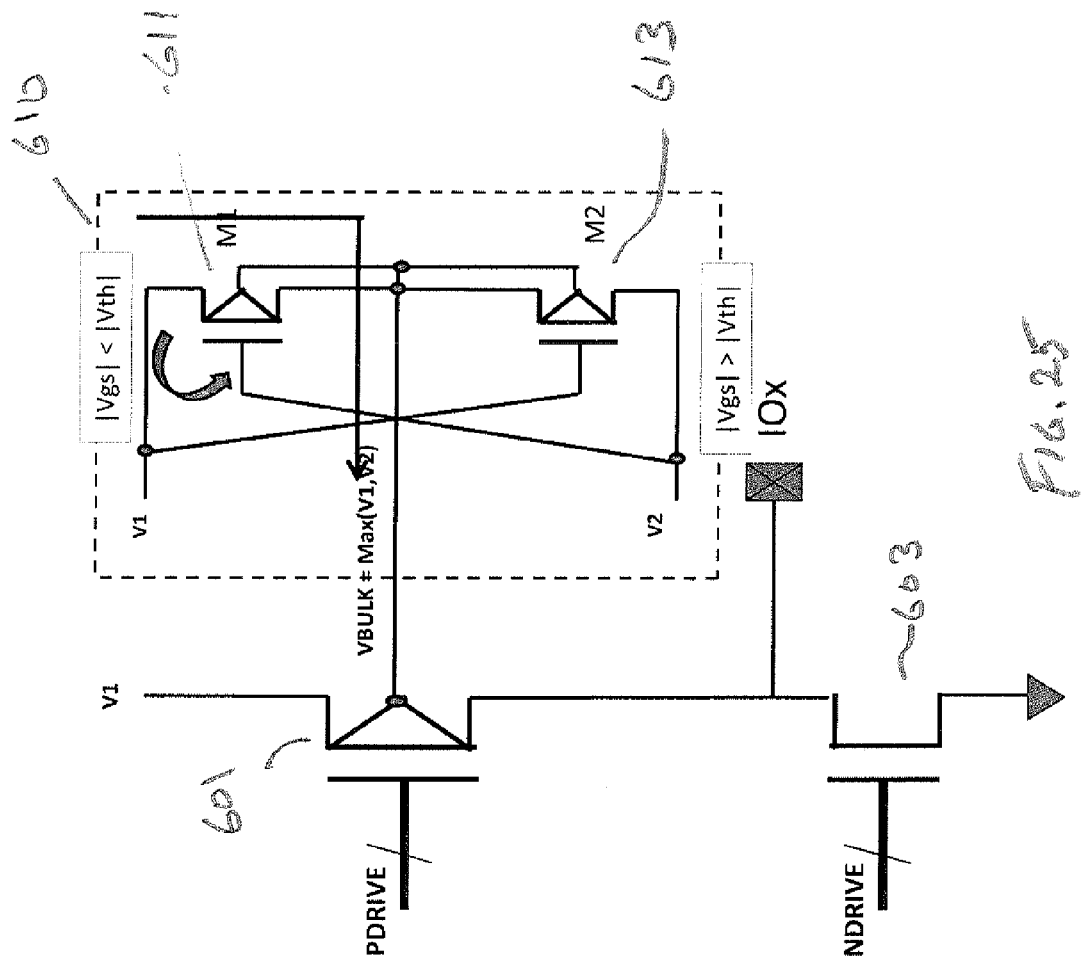

FIG. 25 illustrates the operation in active mode, when V1>V2. M1 611 is turned on and M2 613 is turned off, so that instantaneous current flows through M1 and takes VBULK to V1. As V1>V2, V(bulk-source)=0. Thus, in active mode the bulk-modulation circuit 610 does not have any impact on the driver in active mode.

Figure 26:
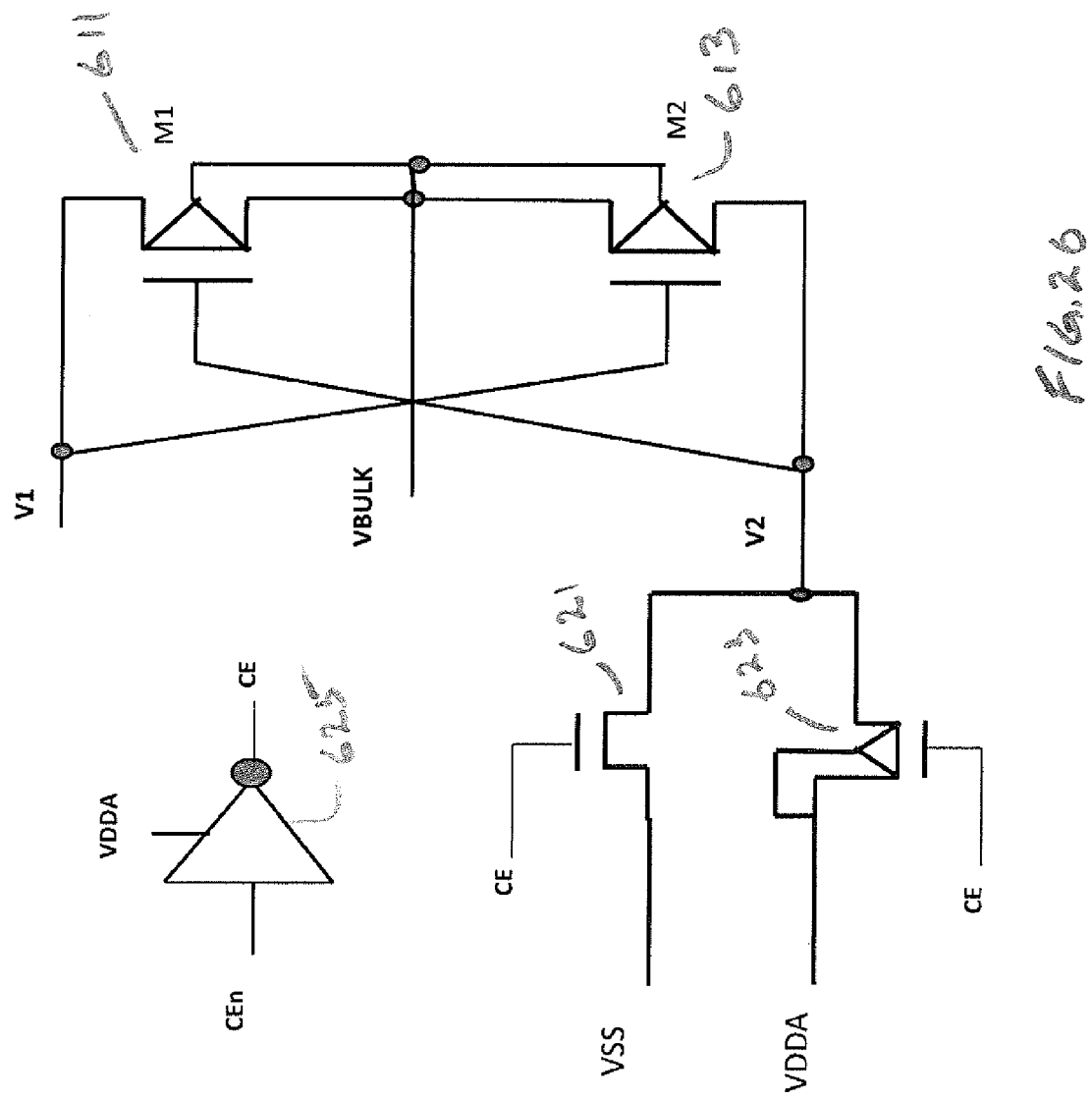
FIG. 26 shows the bulk biasing circuit of FIG. 23 along with an example of a circuit to set the V2 level based on whether the circuit is in active or standby mode.

FIG. 26 shows the bulk biasing circuit of FIG. 23 along with an example of a circuit to set the V2 level based on whether the circuit is in active or standby mode. In the example where the driver is the off-chip driver of a memory circuit, V1 can be taken as VDD and then, depending on the mode, V2 is then either ground (or, more specifically, the low VSS level on the chip) or a higher supply level on the chip, such as an analog supply level VDDA>VDD that may be used in some sense amp operations. For example, VDD could be the basic on-chip high level of, say, 3V and VDDA a value of 3.3V or so used in pre-charging bit lines in a sensing operation. Table 1 illustrates the logic to switch between Active and Stand-by Modes:

TABLE 1

| Condition | V2 | VBULK |
|---|---|---|
| Stand-by (CEn = 1) | VDDA (>VDD) | Max(V1, V2) |
| Active (CEn = 0) | 0 | V1 = VDD |

As memory systems often use the inverse CEn of the chip enable signal CE, the table is presented in terms of CEn. To implement the logic, the V2 is connected to VSS through an NMOS 621 and to VDDA through a PMOS 623, where both of these transistors have their gates connected to receive CE. If CEn is the signal received over the chip's enable pin, this can be sent through an inverter 625 for CE.

Figure 27:
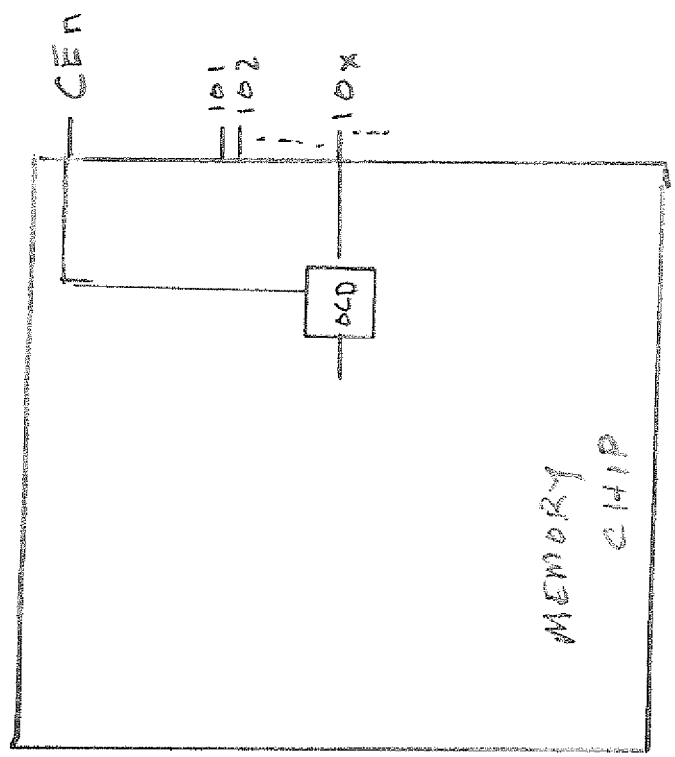
FIG. 27 is a schematic representation of the driver on a memory chip.

FIG. 27 is a schematic representation of the driver on a memory chip showing some of the elements relevant for this discussion, with other elements, including the array, suppressed to simplify the discussion. The CEn pin and some of the IO pins are shown, along with the driver circuit OCD for IOx. The driver OCD receives the CEn signal and is in the active or stand-by mode based on whether or not the chip enable signal is asserted. When the active driver receives an input signal from on the chip, the pin is then driven accordingly. As presented above, each driver of the exemplary embodiment has its own bulk modulation circuit, although in other embodiments a bulk modulation circuit could be shared by one or more drivers. Similarly, when an inverter is used for the enable signal, as with 625 of FIG. 26, each bulk modulation circuit can have an inverter, or, alternately, an inverter can be shared between one or more bulk modulation circuits.

Depending on the embodiment, there may some concerns for implementing the bulk-modulation scheme presented here. One is that, as the bulk of the driver's PMOS is being modulated in a way that other PMOS transistors on the circuit are not, the driver's PMOS is formed in a separate n-well that is not shared with other PMOS devices on die that are not being modulated. A triple guard-ring requirement can be used.

Figure 28:
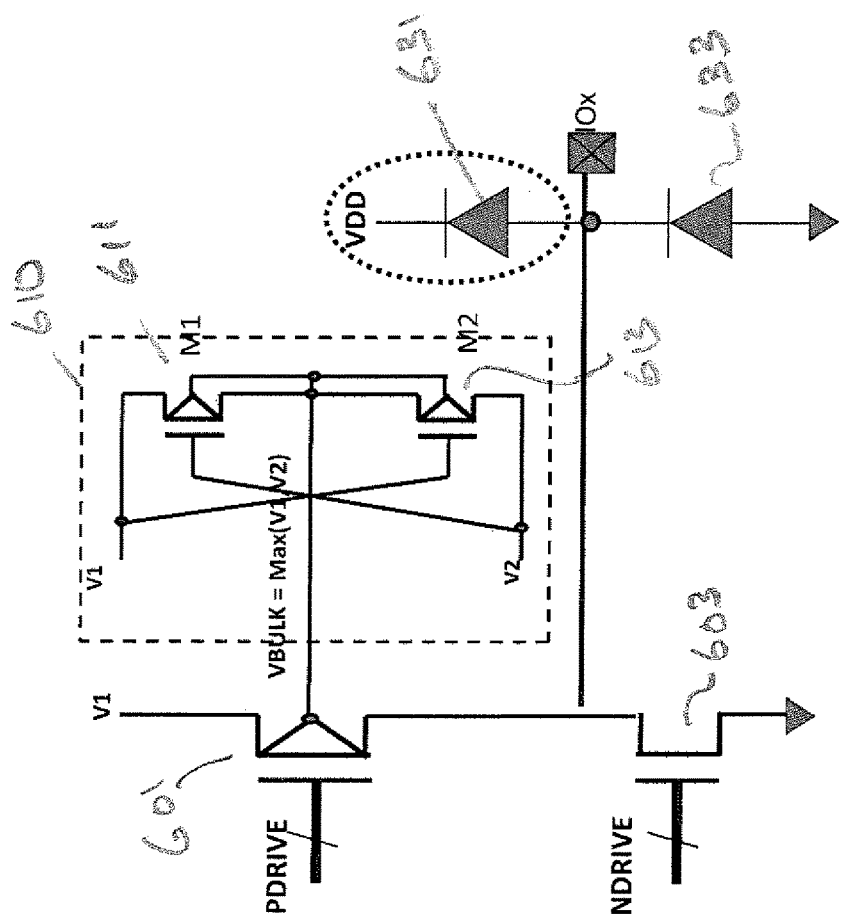
FIG. 28 shows a variation to reduce the effects of electrostatic discharge (ESD).

In some applications, electro-static discharge (ESD), where high-voltage, short duration pulse may be applied to the driver's output. In the arrangement illustrated in FIG. 21, a charge-discharge pulse at IOx can transmitted from the PMOS's drain to the bulk and, as the bulk is connected to V1, on to the supply at V1. By instead connecting the bulk of the driver's PMOS to the bulk-modulation circuit, this will reduce the ESD path from IOx to V1. To address this, didoes can be added as illustrated at 631 and 633 of FIG. 28.

Figure 29:
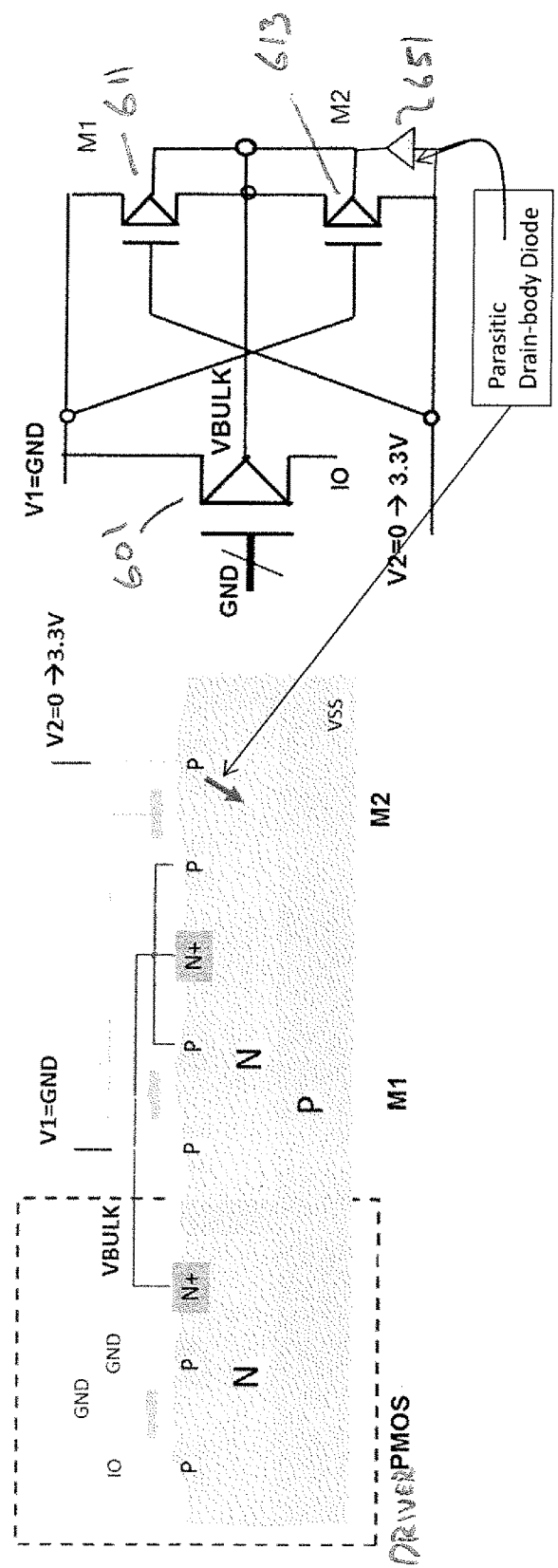
FIG. 29 illustrates an example of a possible parasitic drain-body diode for the bulk modulation circuit.

In some applications of the driver, there may be a concern during ramping-up of the power supply that a transient forward bias occurs for the drain-body parasitic diode in the M2 device 613 of bulk-modulation circuit FIG. 23. Here it is assumed that during power ramp-up, V2 ramps up first and when V2 becomes stable then V1 ramps up. FIG. 29 illustrates the situation.

To the left, FIG. 29 shows the PMOS of the driver as in FIG. 22 and also PMOS M1 611 and PMOS M2 613 of the bulk modulation circuit, where these are shown in schematic to the right. The parasitic drain-body diode for M2 is represented by the arrow at left and at 651 in the schematic at right. When V1=GND=0V and V2=GND, VBULK is floating. When V2 ramps up from 0V to, say, 3.3V, VBULK may be less than V2, forward biasing the parasitic diode 651 and causing large bulk current. This instantaneous forward bias can be avoided if another supply V3 is available to charge BULK node before V1 and V2 start to ramp up, where, for example, (V3=V2)>V1. If VBULK is charged to V3 before V2 starts to ramp-up, the forward biasing of diode can be avoided.

Figure 30:
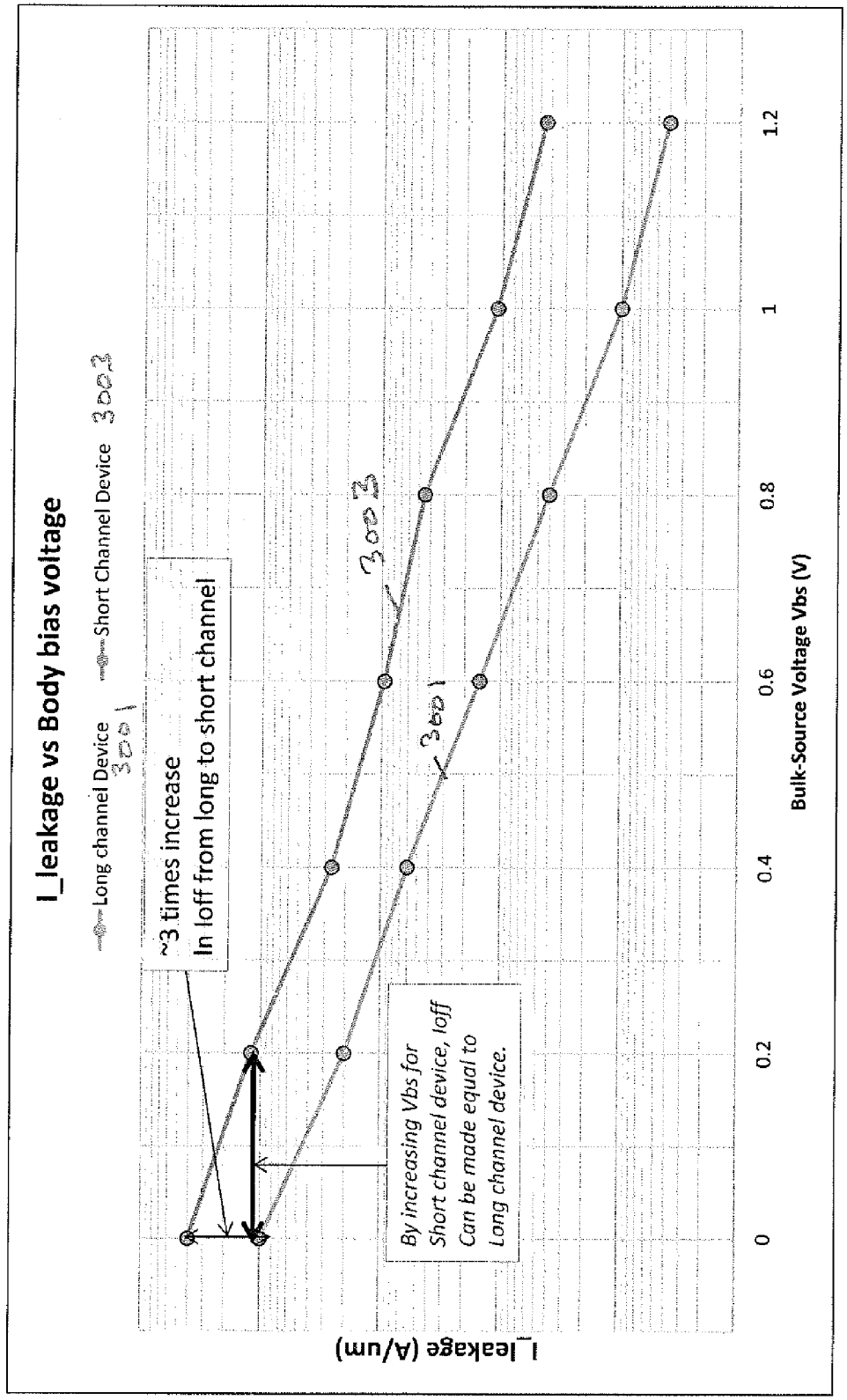
FIG. 30 compares the leakage current to the bulk-source voltage for long channel and short channel devices.
Figure 31:
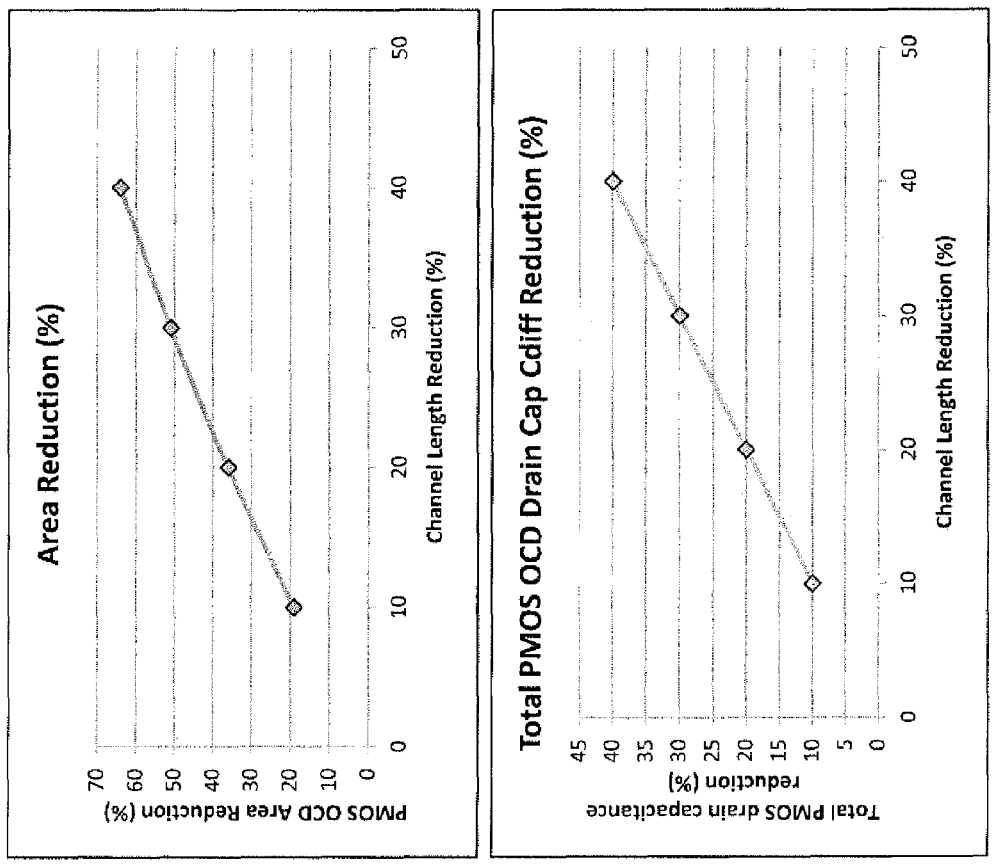
FIG. 31 looks at the relationships of drain capacitance and area to channel length.

FIGS. 30 and 31 illustrate the operation of a driver according to embodiments described above relative to a prior art design. FIG. 30 is a plot of the leakage current $I_{leakage}$ through the driver's PMOS versus the bulk-source voltage Vbs on the device. The upper plot 3003 corresponds to a short channel device and the lower plot 3001 corresponds to a long channel device. As can be seen in the figure, the off state, or leakage, current, current of the short channel device is over twice (about 3 times in this example) that of a similarly biased long channel device. However, by increasing the bulk-source voltage differential, the off current of the short channel device can be reduced to the level of a long channel device. Consequently, the bulk modulation scheme can reduce the leakage in the stand-by mode by a factor one half or more, such as by a third in this particular example, for a given size device.

A short channel device can then be used to provide a corresponding area and capacitance reduction in the driver. For example, the drive capability, or $R_{ON}$, of the PMOS can be expressed as:

$$R_{ON} = \frac{L_1}{\mu * C_{ox} * W_1 * (V_{GS} - V_T)},$$

where $\mu$, $C_{ox}$, $V_{GS}$, and $V_\tau$ are constants. If the PMOS channel length $L_1$ is reduced by 40%, the new channel length is $L_2 = (1-0.04)*L_1 = 0.6 L_1$. To maintain the same $R_{ON}$ for $L_2$, $$\frac{L_1}{W_1} = \frac{L_2}{W_2} \rightarrow \frac{L_1}{W_1} = \frac{0.6 * L_1}{W_2}$$

Or $W_2 = 0.6*W_1$. Consequently, the area reduction of the driver's PMOS after reducing channel length is $W_2*L_2 = 0.36 W_1*L_1$, or a 64% reduction in the driver's PMOS area by reducing channel length by 40%. With this reduction in channel length, $I_{leakage}$ increases, but this can be correspondingly reduced by increasing the bulk bias level in standby mode.

The overlap and diffusion capacitance, $C_{diff}$, of the driver's PMOS is a major contribution to the driver's capacitance, or, in the off-chip driver case, the pin's capacitance. Both of these capacitances are proportional to device width, so that $C_{diff} \alpha$ W. Reducing channel length by 10% also reduces width, and consequently $C_{diff}$, by 10%.

Table 2 compares area and $C_{diff}$ for different channel length reductions to achieve the same $R_{ON}$, assuming the parameters $\mu$, $C_{ox}$, $V_{GS}$, and $V_\tau$ are the same. These data are plotted on FIG. 31, which illustrate the area reduction (at top) and the total PMOS drain capacitance ($C_{diff}$) reduction for an off-chip driver (OCD) application.

TABLE 2

| Channel Length Reduction (%) | Area Reduction (%) | Cdiff reduction (%) |
|---|---|---|
| 10 | 19 | 10 |
| 20 | 36 | 20 |
| 30 | 51 | 30 |
| 40 | 64 | 40 |

In the embodiments described above, to use the smaller PMOS in the driver while still maintaining low leakage current involves the use of the bulk modulation circuit, which will add some area; however, in a typical implementation the width of PMOS switch in the bulk modulation circuit can be 5% to 10% of the total width of PMOS for the driver, resulting in a net saving of area.

CONCLUSION

The foregoing detailed description has been presented for purposes of illustration and description. It is not intended to be exhaustive or to limit the above to the precise form disclosed. Many modifications and variations are possible in light of the above teaching. The described embodiments were chosen in order to explain the principles involved and its practical application, to thereby enable others to best utilize the various embodiments and with various modifications as are suited to the particular use contemplated. It is intended that the scope be defined by the claims appended hereto.

It is claimed:

1. A driver circuit, comprising:
    a first PMOS transistor connected between a first supply voltage and an intermediate node and having a control gate connected to receive an input signal;
    a first NMOS transistor connected between the intermediate node and ground and having a control gate connected to receive the input signal, wherein an output of the driver circuit is provided from the intermediate node; and
    a bulk biasing circuit connected to a body terminal of the first PMOS transistor and connected to receive a mode enable signal, wherein when the mode enable signal is asserted the bulk biasing circuit biases the body terminal to the first supply voltage and when the mode enable signal is de-asserted the bulk biasing circuit biases the body terminal to a voltage greater than the first supply voltage;
    wherein the driver circuit is formed on a non-volatile memory circuit, wherein the output of the driver circuit is connected to drive an input/output pin of the non-volatile memory circuit, wherein the mode enable signal is an enable signal for the non-volatile memory circuit, and wherein the input/output pin is further connected to the first supply voltage through a first diode and connected to ground through a second diode.

2. The driver circuit of claim 1, wherein the bulk biasing circuit comprises:
    a second PMOS transistor connected between the first supply voltage and the body terminal of the first PMOS transistor; and
    a third PMOS transistor connected between the body terminal of the first PMOS transistor and a first node, wherein the body terminal of the second PMOS transistor and the body terminal of the third PMOS transistor are commonly connected with the body terminal of the first PMOS transistor,
    wherein the control gate of the second PMOS transistor is connected to the first node and the control gate of the third PMOS transistor is connected to the first supply voltage, and wherein the first node is set to ground when the mode enable signal is asserted and is set to a second supply voltage greater than the first supply voltage when the mode enable signal is de-asserted.

3. The driver circuit of claim 2, wherein the first node is connected to ground through a second NMOS transistor whose control gate is connected to receive the mode enable signal and connected to the second supply voltage through a fourth PMOS transistor whose control gate is connected to receive the mode enable signal.

4. The driver circuit of claim 1, wherein the non-volatile memory circuit is a monolithic three-dimensional semiconductor memory device having memory cells arranged in multiple physical levels above a silicon substrate and including a charge storage medium.

5. The driver circuit of claim 1, wherein the first PMOS transistor is formed within a separate n-well in a substrate on which the driver circuit is formed.

6. The driver circuit of claim 1, wherein the first PMOS transistor and the first NMOS transistor are each connected to receive the input signal through a corresponding driver.

7. The driver circuit of claim 1, wherein the amount of current flowing through the first PMOS transistor when off is reduced by more than or equal to a factor of two when the body terminal thereof is biased to said voltage greater than the first supply voltage relative to when the body terminal thereof is biased to the first supply voltage.

8. A non-volatile memory circuit, comprising:
a chip enable pin connectable to receive a chip enable signal;
an input-output pin connectable to provide an output signal; and
a driver circuit connected to receive the chip enable signal and receive a first on-chip signal, the driver circuit including:
a first PMOS transistor connected between a first on-chip supply voltage and an intermediate node and having a control gate connected to receive the first on-chip signal, the intermediate node connected to the input-output pin;
a first NMOS transistor connected between the intermediate node and ground and having a control gate connected to receive the first on-chip signal; and
a bulk biasing circuit connected to a body terminal of the first PMOS transistor and connected to receive the chip enable signal, wherein when the chip enable signal is asserted the bulk biasing circuit biases the body terminal to the first supply voltage and when the chip enable signal is de-asserted the bulk biasing circuit biases the body terminal to a voltage greater than the first supply voltage,
wherein the driver circuit is formed on a non-volatile memory circuit, wherein the output of the driver circuit is connected to drive an input/output pin of the non-volatile memory circuit, wherein the chip enable signal is an enable signal for the non-volatile memory circuit, and wherein the input/output pin is further connected to the first supply voltage through a first diode and connected to ground through a second diode.

9. The non-volatile memory circuit of claim 8, wherein the bulk biasing circuit comprises:
a second PMOS transistor connected between the first supply voltage and the body terminal of the first PMOS transistor; and
a third PMOS transistor connected between the body terminal of the first PMOS transistor and a first node,
wherein the body terminal of the second PMOS transistor and the body terminal of the third PMOS transistor are commonly connected with the body terminal of the first PMOS transistor,
wherein the control gate of the second PMOS transistor is connected to the first node and the control gate of the third PMOS transistor is connected to the first supply voltage, and wherein the first node is set to ground when the chip enable signal is asserted and is set to a second supply voltage greater than the first supply voltage when the chip enable signal is de-asserted.

10. The non-volatile memory circuit of claim 9, wherein the first node is connected to ground through a second NMOS transistor whose control gate is connected to receive the chip enable signal and connected to the second supply voltage through a fourth PMOS transistor whose control gate is connected to receive the chip enable signal.

11. The non-volatile memory circuit of claim 8, wherein the non-volatile memory circuit is a monolithic three-dimensional semiconductor memory device having memory cells arranged in multiple physical levels above a silicon substrate and including a charge storage medium.

12. The non-volatile memory circuit of claim 8, wherein the first PMOS transistor is formed within a separate n-well in a substrate on which the driver circuit is formed.

13. The non-volatile memory circuit of claim 8, wherein the first PMOS transistor and the first NMOS transistor are each connected to receive the first on-chip signal through a corresponding driver.

14. A method, comprising:
supplying a driver circuit with a first supply voltage, the driver circuit including:
a first PMOS transistor connected between the first supply voltage and an intermediate node and having a control gate connected to receive an input signal; and
a first NMOS transistor connected between the intermediate node and ground and having a control gate connected to receive an input signal, wherein an output of the driver is provided from the intermediate node; and
in response to an enable signal, operating the driver circuit in either an active mode, in which a body terminal of the first PMOS is biased to the first supply voltage, or a standby mode, in which the body terminal of the first PMOS is biased to a voltage greater than the first supply voltage,
wherein the driver circuit is formed on a non-volatile memory circuit, wherein the output of the driver is connected to drive an input/output pin of the memory circuit, wherein the driver circuit is operated in the active mode when a chip enable signal for the memory circuit is asserted and operated in the standby mode when the chip enable signal for the memory circuit is de-asserted, and wherein the input/output pin is further connected to the first supply voltage through a first diode and connected to ground through a second diode.

15. The method of claim 14, wherein the driver circuit further includes a bulk biasing circuit comprising:
a second PMOS transistor connected between the first supply voltage and the body terminal of the first PMOS transistor; and
a third PMOS transistor connected between the body terminal of the first PMOS transistor and a first node,
wherein the body terminal of the second PMOS transistor and the body terminal of the third PMOS transistor are commonly connected with the body terminal of the first PMOS transistor,
wherein the control gate of the second PMOS transistor is connected to the first node and the control gate of the third PMOS transistor is connected to the first supply voltage, and wherein the first node is set to ground in the active mode and is set to a second supply voltage greater than the first supply voltage in the stand by node.

16. The method of claim 15, wherein the first node is connected to ground through a second NMOS transistor whose control gate is connected to receive a mode enable signal and connected to the second supply voltage through a fourth PMOS transistor whose control gate is connected to receive the mode enable signal, wherein the mode enable signal is asserted in the active mode and de-asserted in the standby mode.

17. The method of claim 14,
wherein the non-volatile memory circuit is a monolithic three-dimensional semiconductor memory device having memory cells arranged in multiple physical levels above a silicon substrate and including a charge storage medium.

18. The method of claim 14, further comprising:
supplying each of the first PMOS transistor and the first NMOS transistor with the input signal through a corresponding driver.

\* \* \* \* \*